United States Patent
Fujita et al.

(10) Patent No.: US 12,019,110 B2
(45) Date of Patent: Jun. 25, 2024

(54) MEASUREMENT SYSTEM AND RADIO WAVE BLOCKING UNIT

(71) Applicant: Maxell, Ltd., Kyoto (JP)

(72) Inventors: Masao Fujita, Kyoto (JP); Masayuki Toyoda, Kyoto (JP); Issei Watanabe, Tokyo (JP)

(73) Assignee: Maxell, Ltd., Kyoto (JP)

(*) Notice: Subject to any disclaimer, the term of this patent is extended or adjusted under 35 U.S.C. 154(b) by 120 days.

(21) Appl. No.: 17/788,817

(22) PCT Filed: Nov. 18, 2020

(86) PCT No.: PCT/JP2020/043040
§ 371 (c)(1),
(2) Date: Jun. 24, 2022

(87) PCT Pub. No.: WO2021/131420
PCT Pub. Date: Jul. 1, 2021

(65) Prior Publication Data
US 2023/0042017 A1    Feb. 9, 2023

(30) Foreign Application Priority Data
Dec. 27, 2019 (JP) ................. 2019-239116

(51) Int. Cl.
*G01R 29/10* (2006.01)
*H04B 17/10* (2015.01)

(52) U.S. Cl.
CPC ......... *G01R 29/105* (2013.01); *H04B 17/101* (2015.01)

(58) Field of Classification Search
CPC .............. G01R 29/105; G01R 29/0871; G01R 29/0821; H04B 17/101; B32B 7/025; H05K 9/00; H01Q 17/00
See application file for complete search history.

(56) References Cited

U.S. PATENT DOCUMENTS 6,007,905 A    12/1999 Kudo et al.
2018/0172747 A1*  6/2018 Qi ................. G01R 29/0821
(Continued)

FOREIGN PATENT DOCUMENTS

JP    1-187098 U    11/1989
JP    2-303095 A    12/1990
(Continued)

OTHER PUBLICATIONS

International Search Report, issued in PCT/JP2020/043040, dated Jan. 19, 2021.

*Primary Examiner* — Hai V Tran
*Assistant Examiner* — Michael M Bouizza
(74) *Attorney, Agent, or Firm* — Birch, Stewart, Kolasch & Birch, LLP

(57) ABSTRACT

Provided are a measurement system and a radio wave shielding member that include a radio wave absorber that has light transmittance and absorbs radio waves other than the radio waves to be measured, and thus is suitable for the measurement of radio wave properties.
The measurement system includes a measuring target device 11, a measuring device 12 that emits and/or receives radio waves to measure the measuring target device, and a radio wave absorber 10 that has light transmittance and absorbs radio waves in and above the millimeter wave band. The radio wave absorber includes a transparent support member 2 and a radio wave absorbing sheet 1 that is attached to one surface of the support member. The radio wave absorbing sheet includes a resistive film 3, a dielectric layer 4, and a radio wave shielding layer 5 which are stacked on top of each other and all of which have light transmittance. The radio wave absorber blocks and/or absorbs unwanted radio waves around the measuring target device.

17 Claims, 12 Drawing Sheets

(56) References Cited

U.S. PATENT DOCUMENTS

| | | | |
|---|---|---|---|
| 2020/0146191 A1 | 5/2020 | Toyoda et al. | |
| 2021/0194147 A1* | 6/2021 | Nagano | B32B 15/085 |
| 2021/0351489 A1* | 11/2021 | Hiramatsu | H01Q 1/08 |
| 2022/0071071 A1* | 3/2022 | Mutou | H01Q 17/00 |

FOREIGN PATENT DOCUMENTS

| | | |
|---|---|---|
| JP | 8-307088 A | 11/1996 |
| JP | 3038986 U | 6/1997 |
| JP | 10-41674 A | 2/1998 |
| JP | 2008-268173 A | 11/2008 |
| JP | 2011-192978 A | 9/2011 |
| JP | 2014-190830 A | 10/2014 |
| KR | 10-2018-0076012 A | 7/2018 |
| WO | WO2008/117499 A1 | 10/2008 |
| WO | WO 2018/163584 A1 | 9/2018 |

\* cited by examiner

MEASUREMENT SYSTEM AND RADIO WAVE BLOCKING UNIT

TECHNICAL FIELD

The present disclosure relates a measurement system and a radio wave shielding member that include a radio wave absorber that absorbs radio waves, and in particular include a radio wave absorber that absorbs unwanted radio waves that are to be noise components during the measurement of radio wave properties, and also has light transmittance to be able to transmit a certain amount of light.

The radio wave shielding member of the present application shall not be related to the test facilities separately notified by the Minister of Internal Affairs and Communications pursuant to the provisions of Article 6 paragraph (1) item (i) of the Ordinance for Enforcement of the Radio Act, which are specified as test facilities for conducting tests on, e.g., research and development of radio waves according to the Ministry of Internal Affairs and Communications Notification No. 173 (Mar. 28, 2006).

BACKGROUND ART

An anechoic chamber is used for, e.g., the experiments of radio equipment and the measurements of EMC (noise field intensity). The anechoic chamber has a shield space surrounded by the walls made of a conductive material such as metal in order to prevent the leakage of radio waves from the inside to the outside of the chamber as well as the penetration of external radio waves into the chamber. Moreover, a radio wave absorber is arranged on the inner surfaces of the walls in order to prevent the reflection of radio waves from the inner walls. Thus, the radio wave properties of the radio equipment (measuring object) can be measured with an extremely high S/N ratio.

The radio wave absorber arranged on the inner walls of the anechoic chamber may be, e.g., a square pyramid shaped conductive member obtained by coating a synthetic resin sponge or a polystyrene foam assembly with carbon particles. This radio wave absorber is placed with its tip facing the inside of the anechoic chamber. As an example of the radio wave absorber arranged on the inner walls of the anechoic chamber, Patent Document 1 proposes a radio wave absorber that is formed by fusing first foamed particles with a conductive surface and second foamed particles with a non-conductive surface.

PRIOR ART DOCUMENTS

Patent Documents

Patent Document 1; JP H10(1998)-041674 A

DISCLOSURE OF INVENTION

Problem to be Solved by the Invention

The conventional radio wave absorber of Patent Document 1 prevents the tip portion of the square pyramid shape from being deformed for a long period of time, and can have excellent radio wave absorption properties over a wide band from about 30 MHz to about 10 GHz for a long period of time.

However, the conventional radio wave absorber is a black member composed of a foamable resin crated with carbon particles. For this reason, light cannot pass through the walls of the anechoic chamber on which such radio wave absorbers are arranged side by side. Thus, the inside of the anechoic chamber cannot be visually observed from the outside during the measurement of the radio wave properties. Moreover, when an image recorder such as a video camera is placed in the anechoic chamber to observe the inside, measures should be taken to avoid the influence of noise generated from the image recorder on the measurement. Therefore, it is difficult to check, e.g., whether the state of the measuring object is properly maintained while the data for the radio wave properties is being acquired.

Further, when the radio wave absorber is replaced, the carbon particles coated on the surface of the resin material are likely to adhere to the hands or the like, leading to a decrease in workability and an increase in maintenance cost of the anechoic chamber.

In experiments and measurements concerning radio waves, the S/N ratio may be improved by effectively blocking unwanted radio waves other than the radio waves to be measured even without the use of an anechoic chamber, which is designed to house the device to be measured, completely cover the perimeter of the device, and significantly attenuate the intensity of the radio waves used. In this case, there may be two configurations; one is to cover the entire perimeter of the measuring device with a shielding member against unwanted radio waves; the other is to cover only a part of the perimeter of the measuring device with the shielding member. In either case, if the shielding member has light transmittance, the measurement state can easily be confirmed from the outside.

To solve the above conventional problems, the present disclosure provides a measurement system including a radio wave absorber that has light transmittance and absorbs radio waves other than the radio waves to be measured, and thus is suitable for the measurement of radio wave properties. The present disclosure also provides a radio wave shielding member using the radio wave absorber to cover a measuring device.

Means for Solving Problem

A measurement system of the present disclosure includes the following: a measuring target device; a measuring device that emits and/or receives radio waves to measure the measuring target device; and a radio wave absorber that has light transmittance and absorbs radio waves in and above the millimeter wave band. The radio wave absorber includes a transparent support member and a radio wave absorbing sheet that is attached to one surface of the support member. The radio wave absorbing sheet includes a resistive film, a dielectric layer, and a radio wave shielding layer which are stacked on top of each other and all of which have light transmittance. The radio wave absorber blocks and/or absorbs unwanted radio waves around the measuring target device.

A radio wave shielding member of the present disclosure includes a housing that covers the sides and the top of a measuring target device and/or a measuring device that emits and/or receives radio waves in and above the millimeter wave band to measure the measuring target device. The radio wave shielding member is able to house the measuring target device and/or the measuring device. At least a portion of the housing is transparent, and a radio wave absorbing sheet is attached to the transparent portion of the housing. The radio wave absorbing sheet includes a resistive film, a dielectric layer, and a radio wave shielding layer which are stacked on top of each other and all of which have light transmittance.

Effects of the Invention

The measurement system of the present disclosure includes a measuring target device, a measuring device, and a radio wave absorber that has light transmittance and absorbs radio waves in and above the millimeter wave band. When the measuring target device is measured with the measuring device using radio waves in the millimeter wave band, the radio wave absorber blocks and absorbs ambient noise components. Thus, the measurement can be performed with a high S/N ratio, and the states of the measuring target device and the measuring device can be visually observed.

The radio wave shielding member of the present disclosure includes a housing that houses a measuring target device and/or a measuring device. A radio wave absorbing sheet with light transmittance is attached to a transparent portion of the housing. Thus, the states of the measuring target device and/or the measuring device housed in the radio wave shielding member can be visually observed from the outside.

DESCRIPTION OF THE INVENTION

Figure 1:
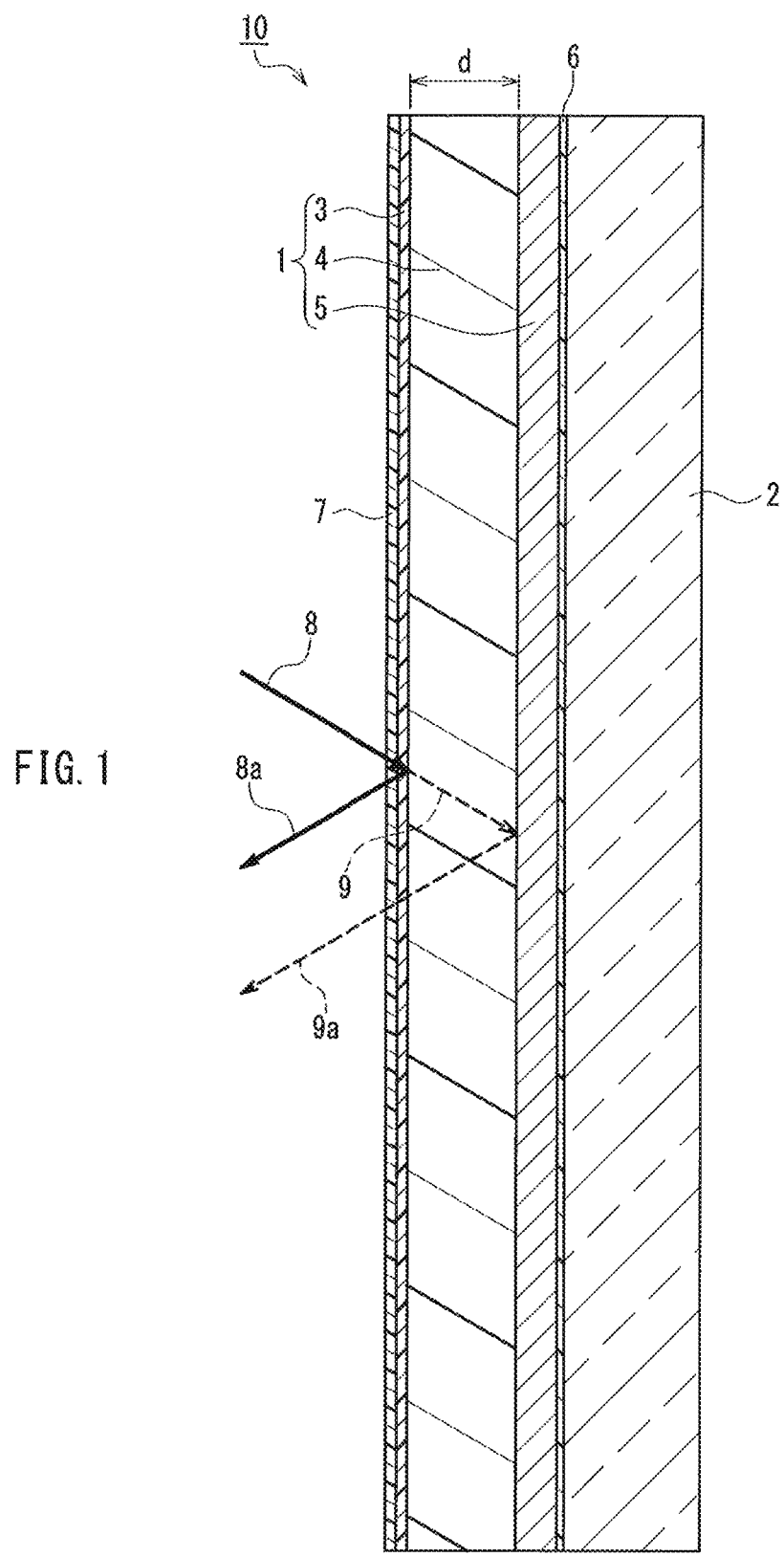
FIG. 1 is a cross-sectional view illustrating a configuration of a radio wave absorber of this embodiment.

A measurement system of the present disclosure includes a measuring target device, a measuring device that emits and/or receives radio waves to measure the measuring target device, and a radio wave absorber that has light transmittance and absorbs radio waves in and above the millimeter wave band. The radio wave absorber includes a transparent support member and a radio wave absorbing sheet that is attached to one surface of the support member. The radio wave absorbing sheet includes a resistive film, a dielectric layer, and a radio wave shielding layer which are stacked on top of each other and all of which have light transmittance. The radio wave absorber blocks and/or absorbs unwanted radio waves around the measuring target device.

The measurement system of the present disclosure includes the radio wave absorber that has light transmittance and absorbs radio waves of a desired frequency. Therefore, the states of the measuring target device and the measuring device are easily visible through the radio wave absorber. This configuration can confirm the measurement state during the measurement of the radio wave properties with the measuring device, and thus can improve the measurement accuracy.

In the measurement system with the above configuration, the total light transmittance of the radio wave absorber is preferably 30% or more. When the total light transmittance is 30% or more, the state of the measurement system can easily be recognized during the measurement.

The measuring target device may be a device that emits and/or receives radio waves in and above the millimeter wave band.

It is preferable that the radio wave absorber has a fitting portion that can be fitted to a fitting portion of another radio wave absorber, and that a plurality of the radio wave absorbers are fitted together through the fitting portions to form one radio wave absorber. Thus, a plurality of radio wave absorbers can easily be combined into a large radio wave absorber. Moreover, the radio wave absorber can be adapted to the measurement conditions such as the size and arrangement of the measuring target device and the measuring device.

It is preferable that the support member is deformable and the radio wave absorber is deformable in accordance with the shape of the measuring target device and/or the measuring device. This can facilitate the production of the radio wave absorber that is to be placed to cover the circumference of the measuring target device according to the deformation of the support member.

It is preferable that the radio wave absorber is placed at least on the back side of the measuring target device as viewed from the measuring device. This configuration can easily and effectively block or attenuate unwanted radio waves during the measurement with the measuring device, and can measure the radio wave properties with a high S/N ratio.

It is preferable that the radio wave absorber constitutes at least a part of the side and the top of a radio wave shielding member that houses the measuring device and/or the measuring target device. This configuration can isolate the entire measurement environment from unwanted radio waves, and can measure the radio wave properties with a high S/N ratio.

In this case, the measuring device and/or the measuring target device may be housed in separate radio wave shielding members.

Another radio wave shielding member that houses the measuring device and/or the measuring target device may be further arranged in the radio wave shielding member. In other words, the measuring device and/or the measuring target device may be housed in the double radio wave shielding member.

The radio wave shielding member may house a plurality of the measuring target devices and/or a plurality of the measuring devices.

It is preferable that the radio wave shielding member covers the bottom of the measuring device and/or the measuring target device. This configuration can effectively eliminate noise factors such as the penetration of unwanted radio waves from underneath the measurement environment or the undesired absorption of measuring radio waves by the bottom.

It is preferable that the radio wave shielding member includes a transparent housing to which the radio wave absorbing sheet is attached. Thus, the housing with a shape suitable for the measurement environment can be used as the radio wave shielding member that easily prevents the penetration of unwanted radio waves.

In this case, it is preferable that a plurality of the radio wave absorbing sheets are attached to the housing and spaced at intervals of 3 mm or less (which is a distance between the cross sections). When the distance between the adjacent radio wave absorbing sheets is 3 mm or less, unwanted radio waves will be prevented from entering through the space, and the radio wave properties can be measured in a good environment.

A radio wave shielding member of the present disclosure includes a housing that covers the sides and the top of a measuring target device and/or a measuring device that emits and/or receives radio waves in and above the millimeter wave band to measure the measuring target device. The radio wave shielding member is able to house the measuring target device and/or the measuring device. At least a portion of the housing is transparent, and a radio wave absorbing sheet is attached to the transparent portion of the housing. The radio wave absorbing sheet includes a resistive film, a dielectric layer, and a radio wave shielding layer which are stacked on top of each other and all of which have light transmittance.

The radio wave shielding member of the present disclosure can successfully absorb predetermined radio waves and achieve the measurement of the radio wave properties with a high S/N ratio. Moreover, the states of the measuring target device and the measuring device can be directly visually observed from the transparent portion of the housing. Thus, it is possible to easily confirm whether the measurement is performed under appropriate conditions.

In the present specification, the term "radio wave shielding member" refers to a container member that is able to house the measuring target device and shield it from external radio waves. The radio wave shielding member is configured to cover at least the sides and the top of the measuring target device. In some cases, it may not be necessary to prevent unwanted radio waves that would enter from the bottom, e.g., when the measuring target device is placed on a member that does not transmit radio waves. Therefore, the bottom is not essential for the radio wave shielding member. Moreover, the radio wave shielding member of the present disclosure and an anechoic chamber, which is test equipment notified based on the Ordinance for Enforcement of the Radio Act, differ from each other in the configuration, the degree of attenuation of radio wave intensity, or the like. In addition, the size of the radio wave shielding member is not limited to a size generally known as the anechoic chamber (e.g., a size large enough for a person to enter).

It is preferable that the housing of the radio wave shielding member further covers the bottom of the measuring device and/or the measuring target device. Thus, the radio wave properties can be measured with high accuracy regardless of the condition underneath the measurement environment.

The total light transmittance of the portion to which the radio wave absorbing sheet is attached may be 30% or more. Thus, the inside of the radio wave shielding member can easily be confirmed from the outside.

The radio wave shielding member may house a plurality of the measuring target devices and/or a plurality of the measuring devices.

The measuring target device housed in the radio wave shielding member may be a device that emits and/or receives radio waves in and above the millimeter wave band.

Hereinafter, the measurement system and the radio wave shielding member of the present disclosure will be described with reference to the drawings.

Embodiment

[Radio Wave Absorber]

FIG. 1 is a cross-sectional view of a radio wave absorber of an embodiment.

In FIG. 1, the cross section of the radio wave absorber is enlarged in the thickness direction (i.e., the horizontal direction of FIG. 1) so that the configuration of a radio wave absorbing sheet can be described in detail.

As illustrated in FIG. 1, the radio wave absorber 10 includes a radio wave absorbing sheet 1 and a transparent support member 2. The radio wave absorbing sheet 1 has flexibility and light transmittance, e.g., a total light transmittance of 60% or more.

The radio wave absorbing sheet 1 of this embodiment includes a resistive film 3, a dielectric layer 4, and a radio wave shielding layer 5 which are stacked on top of each other and all of which have light transmittance. In FIG. 1, an adhesive layer 6 is formed on the back of the radio wave shielding layer 5, i.e., on the surface of the radio wave shielding layer 5 facing away from the dielectric layer 4. The radio wave absorbing sheet 1 is attached to the support member 2 with the adhesive layer 6. Moreover, a protective layer 7 is formed on the front of the resistive film 3, i.e., on the surface of the resistive film 3 facing away from the dielectric layer 4.

The radio wave absorbing sheet 1 of this embodiment is a radio interference type ($\lambda/4$ type or reflection type) radio wave absorber.

As illustrated in FIG. 1, a part of a radio wave 8 that has reached the dielectric layer 4 passes through the dielectric layer 4 to the interface between the dielectric layer 4 and the radio wave shielding layer 5 located on the back of the dielectric layer 4, as indicated by a radio wave 9. The radio wave 9 is reflected from this interface, and then passes through the dielectric layer 4 and exits as indicated by a second-order reflected wave 9a. Further, a part of the radio wave 8 that has reached the dielectric layer 4 is reflected from the surface of the dielectric layer 4, as indicated by a first-order reflected wave 8a.

In this case, the thickness d of the dielectric layer 4 is set to one-quarter of the wavelength $\lambda$ of the incident radio wave ($d=\lambda/4$). Thus, the radio wave absorption frequency can be controlled, and the first-order reflected wave 8a and the second-order reflected wave 9a cancel each other out because the phase difference between the two waves is close to 180° ($\lambda/2$), although the amplitude ratio is not 1. The reflected wave that would remain after the cancellation of the first-order reflection can be canceled out by the third- and higher-order reflected waves.

Since the radio wave reflected from the surface (the first-order reflected wave) and the radio wave reflected from the radio wave shielding layer 5 (conductive mesh) cancel each other out, the radio waves are apparently absorbed.

The surface of the radio wave shielding layer 5 facing the dielectric layer 4, which is the interface between the two layers, reflects the incident radio wave.

According to the principle of radio wave absorption of the radio interference type radio wave absorbing sheet of this embodiment, the radio wave shielding layer 5 needs to function as a reflective layer that reflects the incident radio wave. The radio wave shielding layer 5 also needs to have flexibility and light transmittance. Specific examples of the radio wave shielding layer 5 that can meet these requirements include a conductive mesh composed of conductive fibers.

The resistive film 3 is formed on the front of the dielectric layer 4, i.e., on the surface of the dielectric layer 4 that faces away from the radio wave shielding layer 5 and receives the incident radio wave. The resistive film 3 serves to match the impedance of the radio wave absorbing sheet 1 to that of the outside (the external environment, usually the air).

The radio wave propagating in the air may be reflected and scattered as it enters the radio wave absorbing sheet 1, causing a reduction in the radio wave absorption properties. To prevent this, it is important that the input impedance of the radio wave absorbing sheet 1 is close to 377Ω, which is the impedance of the air (actually the vacuum impedance), when the incident radio wave strikes the surface of the radio wave absorbing sheet 1. In the radio wave absorbing sheet 1 of this embodiment, the resistive film 3 is made of, e.g., a conductive organic polymer. The use of the conductive organic polymer can maintain the flexibility of the radio wave absorbing sheet 1, and can also prevent damage such as cracking in the resistive film 3 even if the radio wave absorbing sheet 1 is strongly bent. Thus, the surface resistance of the resistive film 3 is not changed, and good impedance matching can be achieved.

The adhesive layer 6 is formed on the back of the radio wave shielding layer 5 so that the radio wave absorbing sheet 1 can easily be attached to a predetermined location. The adhesive layer 6 can be obtained simply by the application of an adhesive resin paste.

The adhesive layer 6 is not essential for the radio wave absorbing sheet of this embodiment. When the radio wave absorbing sheet 1 is attached to a predetermined position of the support member 2, an adhesive member may be provided on the surface of the support member 2 that comes into contact with the radio wave absorbing sheet 1. Alternatively, the radio wave absorbing sheet 1 and the support member 2 may be joined together by, e.g., an adhesive or a double-sided tape. These methods allow the radio wave absorbing sheet 1 to adhere closely to the surface of the support member 2.

It is not essential to use the adhesive member between the radio wave absorbing sheet 1 and the support member 2. Various methods may be used to fix the radio wave absorbing sheet 1 on the surface of the support member 2. For example, the radio wave absorbing sheet 1 and the support member 2 may be stacked on top of each other, and then their end portions may be fastened with, e.g., an adhesive tape or fasteners such as screws and nails to prevent the radio wave absorbing sheet 1 from moving. Moreover, there is no need to bond the entire surfaces of the overlapping regions of the radio wave absorbing sheet 1 and the support member 2 together, as long as the radio wave absorbing sheet 1 can remain on the surface of the support member 2, and it is also possible to prevent the penetration of unwanted radio waves or the leakage of radio waves through the gap that would be formed in the portion where the radio wave absorbing sheet 1 and the support member 2 are not bonded to each other.

The protective layer 7 is formed on the surface of the resistive film 3, i.e., on the outermost surface of the radio wave absorbing sheet 1, on which radio waves are incident. The protective layer 7 protects the resistive film 3.

In the radio wave absorbing sheet 1 of this embodiment, the surface resistance of the conductive organic polymer used for the resistive film 3 can be affected by humidity in the air. The resistive film 3 made of resin may be damaged if the film surface is scratched with a sharp object or is scraped with a hard material. For this reason, it is preferable that the surface of the resistive film 3 is covered with the protective layer 7.

However, the protective layer 7 is not essential for the radio wave absorbing sheet 1 of this embodiment. Depending on the material (e.g., the conductive organic polymer) of the resistive film 3, if there is little concern that the surface resistance will be changed by the adhesion of water to the surface of the resistive film 3 or that the surface of the resistive film 3 will be damaged, the radio wave absorbing sheet 1 may not be provided with the protective layer 7.

The protective layer 7 may be made of a resin material such as polyethylene terephthalate, as will be described later. The resin material used for the protective layer 7 has a certain resistance. However, the effect of the protective layer 7 on the surface resistance of the radio wave absorbing sheet can be regarded as negligible for practical applications by reducing the thickness of the protective layer 7. Moreover, it is also possible to adjust the surface resistance of the resistive film 3 in view of the resistance of the protective layer 7 so as to achieve good impedance matching.

The support member 2 should be sufficiently rigid to hold the attached radio wave absorbing sheet 1 and maintain the shape of the radio wave absorber 10. The support member 2 should also be transparent in order to ensure the light transmittance of the radio wave absorber 10 as a whole. Examples of the support member 2 include general transparent members such as an acrylic plate, sheet glass, and other transparent plates.

The thickness of the support member 2 may be appropriately determined so that the support member 2 has strength and rigidity high enough to maintain the shape of the radio wave absorber 10. For example, when the radio wave absorber 10 is in the form of a plate, as illustrated in FIG. 1, the support member 2 may be an acrylic plate with a length of 250 mm, a width of 500 mm, and a thickness of 3 mm, and the radio wave absorbing sheet 1 having the same size (i.e., a length of 250 mm and a width of 500 mm) may be attached to the support member 2. In this case, it is difficult for the radio wave absorber 10 to stand stably by itself. Therefore, a base member may be appropriately used to support the radio wave absorber 10 substantially in the upright position. Alternatively, the support member 2 may be made thicker or have, e.g., protrusions on the lower portion of it so that the radio wave absorber 10 can stand upright by itself.

Regarding the light transmittance of the support member 2, while there is a certain limit to the light transmittance of the radio wave absorbing sheet 1 to have sufficient radio wave absorption properties, as will be described later, any material may be used for the support member 2 as long as it has the strength to keep the shape of the support member 2. Therefore, the support member 2 may be a highly transparent member having a total light transmittance as high as possible, preferably close to 100%.

In the radio wave absorber 10 of this embodiment, the other side of the radio wave absorber 10 is easily visible through it. In view of this, the total light transmittance of the radio wave absorber 10 as a whole is preferably 30% or more, and more preferably 60% or more, at which the other side of the radio wave absorber 10 is clearly visible through it regardless of the ambient brightness. Needless to say, the radio wave absorber 10 preferably has the highest possible total light transmittance, provided that the light transmittance of the support member 2 is close to 100%, as described above, and the radio wave absorbing sheet 1 has a high light transmittance on condition that the radio wave absorption properties are within an acceptable range.

The support member is not limited to a member that is bonded to the radio wave absorbing sheet and used to support it when the radio wave absorbing sheet alone cannot stand by itself. The support member may be any member that is transparent and has one surface to which the radio wave absorbing sheet is attached to form the radio wave absorber, even if the radio wave absorbing sheet alone can stand by itself

[Measurement System]

As described above, the radio wave absorber 10 of this embodiment can absorb radio waves of a desired frequency by adjusting the material and thickness of the dielectric layer 4 of the radio wave absorbing sheet 1. Moreover, the radio wave absorber 10 can be suitably used in a measurement system for measuring the radio wave properties because the other side of the radio wave absorber 10 is visible through it.

Figure 2:
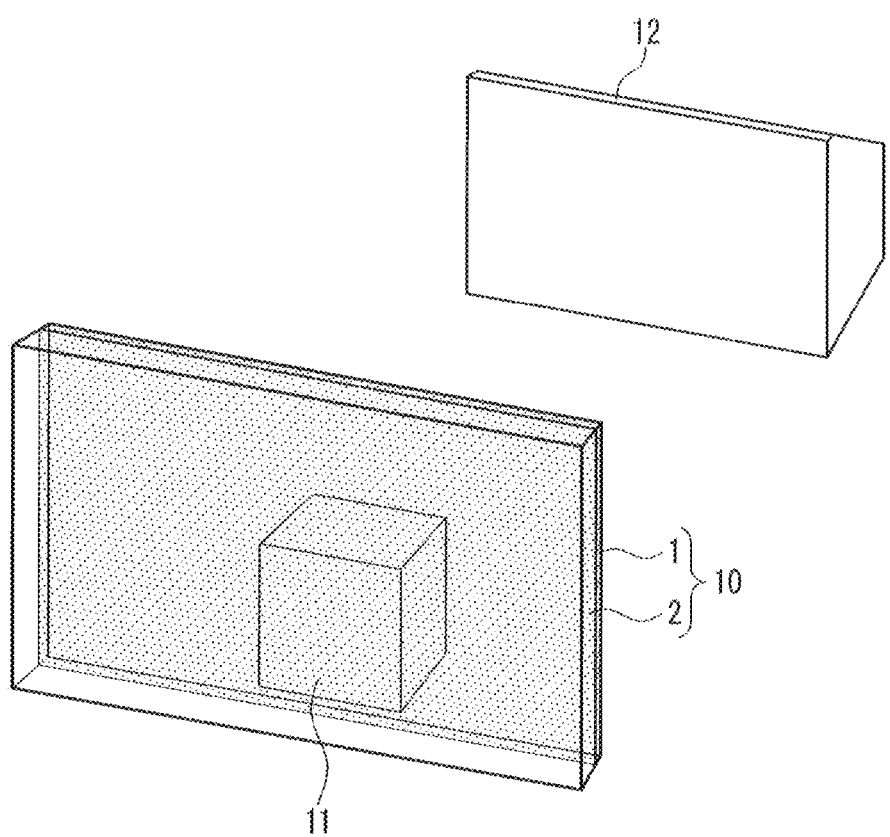
FIG. 2 is a schematic diagram illustrating a configuration of a measurement system of this embodiment.

FIG. 2 is a schematic diagram illustrating a first configuration example of a measurement system of this embodiment.

As illustrated in FIG. 2, in the measurement system of this embodiment, a measuring target device 11 is located opposite a measuring device 12, and the radio wave absorber 10 is placed on the back side of the measuring target device 11 as viewed from the measuring device 12.

The measuring target device 11 means a measuring object for radio wave properties. The measuring device 12 is required to measure the radio wave properties of the measuring target device 11. Thus, various devices in connection with radio waves may be used as the measuring target device 11 and the measuring device 12 depending on the radio wave properties to be measured.

In a first pattern, the measuring target device 11 may be a device that emits predetermined radio waves. More specifically, the measuring target device 11 may be, e.g., a radio wave source, a transmitter, or a transmitting antenna. In this case, the measuring device 12 may be, e.g., a receiver that receives radio waves emitted from the measuring target device 11. The measuring device 12 receives the radio waves from the measuring target device 11, so that frequency characteristics, radio field intensity characteristics, directivity, and other radio wave properties of the radio waves emitted from the measuring target device 11 can be determined.

In a second pattern, the measuring target device 11 may be a device that receives radio waves. More specifically, the measuring target device 11 may be, e.g., a receiver or a receiving antenna. In this case, the measuring device 12 may be, e.g., a transmitter or a transmitting antenna that emits radio waves that are to be received by the measuring target device 11. The measuring target device 11 receives the radio waves from the measuring device 12, so that the radio wave properties such as reception intensity and reception frequency of the measuring target device 11 can be determined.

In a third pattern, the measuring target device 11 may be a device that transmits (emits) and receives radio waves. More specifically, the measuring target device 11 may be, e.g., a transmitter-receiver or a transmitting and receiving antenna. In this case, the radio wave properties of the measuring target device 11 can be determined by analyzing the reception state of the radio waves transmitted from the measuring device 12 and the emitted radio wave properties measured by the measuring device 12.

In a fourth pattern, the measuring target device 11 may be a radio wave reflecting member that does not itself transmit or receive radio waves and the measuring device 12 may be a radar irradiator. The radio wave properties of the radar irradiator (the measuring device 12) may be determined in the following manner. The radar irradiator irradiates the measuring target device 11 with radar waves, and then receives the reflected waves from the measuring target device 11. This makes it possible not only to measure the performance of the radar irradiator, i.e., how accurately the radar irradiator is able to detect the position, shape, etc. of the measuring target device 11, but also to measure the suitable frequency, intensity, and directivity of the radar irradiator. In the fourth pattern, although the radio wave properties of the measuring target device 11 are not measured, the radio wave reflecting member is referred to as the "measuring target device 11" in the present specification because it is the object to be irradiated with radio waves.

In each of the four patterns for measuring the radio wave properties using the measurement system of this embodiment, the radio wave absorber 10 is placed on the back side of the measuring target device 11 as viewed from the measuring device 12. In other words, the radio wave absorber 10 is positioned on the opposite side of the measuring target device 11 to the measuring device 12. The radio wave absorber 10 is located with the radio wave absorbing sheet 1 facing the measuring target device 11 and the measuring device 12. The support member 2 is on the opposite side of the radio wave absorber 10, facing away from the measuring target device 11.

In the measurement system of this embodiment, due to the arrangement of the radio wave absorber 10 on the back side of the measuring target device 11, when radio waves are emitted from the measuring device 12 to the measuring target device 11, the radio wave absorber 10 absorbs the radio waves that have not been directly received by the measuring target device 11 or that have not been applied to the measuring target device 11. Moreover, when radio waves are emitted from the measuring target device 11 to the measuring device 12, the measuring device 12 will receive only the radio waves emitted directly from the measuring target device 12 because the radio wave absorber 10 absorbs unwanted radio waves on the back side of the measuring target device 11.

When the measuring device 12 is a radar, it irradiates the measuring target device 11 with radar waves, and then receives the reflected waves from the measuring target device 11. In this case, the radio wave absorber 10 absorbs unwanted radio waves that would travel from behind the measuring target device 11 and enter the measuring device 12 in the same direction as the reflected waves from the measuring target device 11. Consequently, the measuring device 12 will receive only the radio waves reflected directly from the measuring target device 12.

The radio wave absorber 10 placed on the back side of the measuring target device 11 can absorb unwanted radio waves around the measuring target device 11 as viewed from the measuring device 12. This can effectively prevent unwanted radio waves that are not derived from the measuring target device 11 from being measured by the measuring device 12. Thus the S/N ratio of the measurement in the measuring device 12 can be improved, and the radio wave properties can be determined with higher accuracy.

In the measurement system of this embodiment, the radio wave absorber 10 has at least a certain level of light transmittance. Therefore, the other side of the radio wave absorber 10 is visible through it. As illustrated in FIG. 2, the measuring target device 11 can be visually observed through the radio wave absorber 10 when viewed from the opposite side of the radio wave absorber 10 to the measuring target device 11 and the measuring device 12. Thus it is possible to check, e.g., the position and direction of the measuring target device 11. Similarly, it is also possible to check directly from the back side of the radio wave absorber 10 whether the measuring surface of the measuring device 12 and the measuring target device 11 are facing each other properly. If the radio wave properties are not able to be measured accurately, the measurement state can be recognized and corrected immediately.

Figure 3:
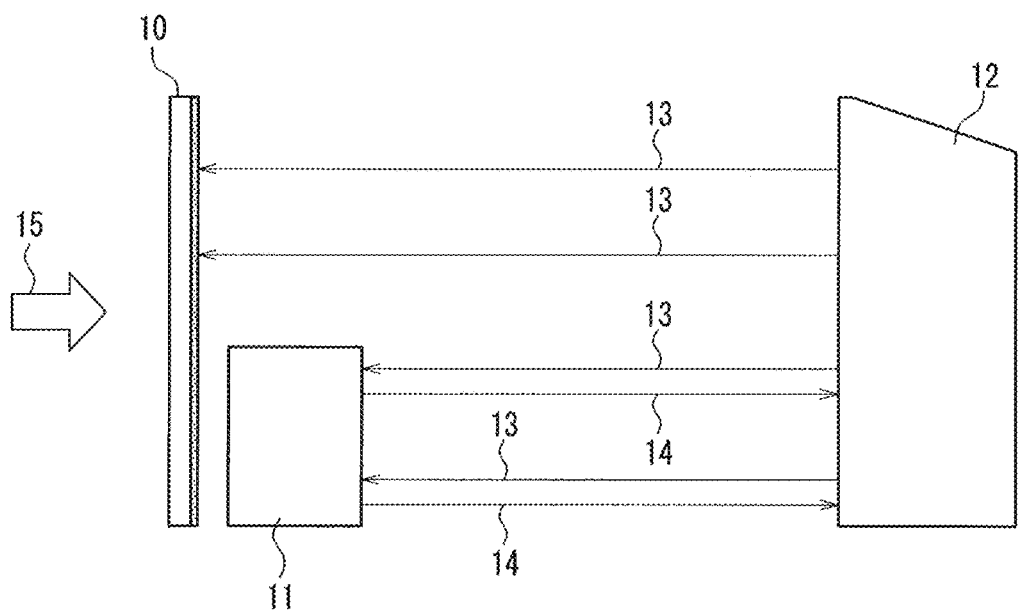
FIG. 3 is an image diagram illustrating the measurement state of the radio wave properties in a measurement system of this embodiment.

FIG. 3 is a schematic diagram illustrating the effect of the measurement system of this embodiment.

FIG. 3 is a side view of the measurement system in the fourth pattern. Specifically, the measuring device 12 (the radar irradiator) irradiates the measuring target device 11 (the radio wave reflecting member) with radar waves to measure the distance to the measuring target device 11 and the shape of the measuring target device 11.

As illustrated in FIG. 3, the measuring device 12 emits radar waves 13 of a predetermined frequency, e.g., a frequency of 60 GHz used for an on-board radar. The radar waves 13 that have struck the surface of the measuring target device 11 are reflected from it, and then the reflected waves 14 return to the measuring device 12. On the other hand, the radar waves 13 that have been directed to a region where the measuring target device 11 is not located are absorbed by the radio wave absorber 10. As viewed from the measuring device 12, the reflected waves 14 from the measuring target device 11 are present in the region where there are no unwanted reflected waves. Thus, the radio wave properties can be measured with less noise.

The radio wave absorber 10 placed on the back side of the measuring target device 11 can block and absorb not only the radar waves 13 that have been emitted from the measuring device 12 and have not been reflected from the measuring target device 11, but also unwanted radio waves that would travel from behind the measuring target device 11 and enter the receiving unit of the measuring device 12. Consequently, the measuring device 12 receives only the reflected waves 14 from the measuring target device 11. Thus, the S/N ratio of the measurement can be improved, thereby reducing a measurement error.

In the measurement system of this embodiment, the radio wave absorber 10 has light transmittance. Therefore, as indicated by the arrow 15 in FIG. 3, the states of the measuring target device 11 and the measuring device 12 can be visually observed through the radio wave absorber 10 when viewed from the back side of the radio wave absorber 10. Thus, the measurement state can be recognized immediately if it is not correct, e.g., if the measuring target device 11 is not aligned with the measuring device 12 or if the measuring target device 11 and the radio wave emitting and receiving surfaces do not face each other properly. In such a ca PP, the measurement may be temporarily stopped, and the measurement state may be corrected so that the measurement results can be obtained with high accuracy.

In FIG. 3, the measuring device 12 is illustrated as a radar irradiator. Needless to say, the relationship between the measuring target device 11 and the measuring device 12 includes various patterns such as transmitter, receiver, and transmitter-receiver. In any case, the measurement system can measure the radio wave properties while removing unwanted radio waves that would be noise around the measuring target device 11 as viewed from the measuring device 12. Moreover, the measurement system can make the measurement of the radio wave properties easily visible from the back side of the radio wave absorber 10.

As described above, the measurement system of this embodiment has a simple configuration in which the radio wave absorber is placed on the back side of the measuring target device as viewed from the measuring device. This configuration eliminates the need of a conventional anechoic chamber or a radio wave shielding member, which will be described later, and facilitates the visual observation of the measurement. Thus, the measurement system can measure any desired radio wave properties with high accuracy.

[Specific Configuration of Radio Wave Absorbing Sheet]

Hereinafter, components of the radio wave absorbing sheet 1 of the radio wave absorber 10 of this embodiment will be described.

(Resistive Film)

As described above, the radio wave absorbing sheet 1 includes the resistive film 3 made of a conductive organic polymer.

The conductive organic polymer may be a conjugated conductive organic polymer and may preferably include polythiophene or its derivatives and polypyrrole or its derivatives.

Specific examples of the polythiophene conductive polymer suitable for the resistive film 3 include the following: poly(thiophene); poly(3-methylthiophene); poly(3-ethylthiophene); poly(3-propylthiophene); poly(3-butylthiophene); poly(3-hexylthiophene); poly(3-heptylthiophene); poly(3-octylthiophene); poly(3-decylthiophene); poly(3-dodecylthiophene); poly(3-octadecylthiophene); poly(3-bromothiophene); poly(3-chlorothiophene); poly(3-iodothiophene); poly(3-cyanothiophene); poly(3-phenylthiophene); poly(3,4-dimethylthiophene); poly(3,4-dibutylthiophene); poly(3-hydroxythiophene); poly(3-methoxythiophene); poly(3-ethoxythiophene); poly(3-butoxythiophene); poly(3-hexyloxythiophene); poly(3-heptyloxythiophene); poly(3-octyloxythiophene); poly(3-decyloxythiophene); poly(3-dodecyloxythiophene); poly(3-octadecyloxythiophene); poly(3,4-dihydroxythiophene); poly(3,4-dimethoxythiophene); poly(3,4-diethoxythiophene); poly(3,4-dipropoxythiophene); poly(3,4-dibutoxythiophene); poly(3,4-dihexyloxythiophene); poly(3,4-diheptyloxythiophene); poly(3,4-dioctyloxythiophene); poly(3,4-didecyloxythiophene); poly(3,4-didodecyloxythiophene); poly(3,4-ethylenedioxythiophene); poly(3,4-propylenedioxythiophene); poly(3,4-butenedioxythiophene); poly(3-methyl-4-methoxythiophene); poly(3-methyl-4-ethoxythiophene); poly(3-carboxythiophene); poly(3-methyl-4-carboxythiophene); poly(3-methyl-4-carboxyethylthiophene); and poly(3-methyl-4-carboxybutylthiophene).

Specific examples of the polypyrrole conductive polymer suitable for the resistive film 3 include the following: polypyrrole; poly(N-methylpyrrole); poly(3-methylpyrrole); poly(3-ethylpyrrole); poly(3-n-propylpyrrole); poly(3-butylpyrrole); poly(3-octylpyrrole); poly(3-decylpyrrole);

poly(3-dodecylpyrrole); poly(3,4-dimethylpyrrole); poly(3,4-dibutylpyrrole); poly(3-carboxypyrrole); poly(3-methyl-4-carboxypyrrole); poly(3-methyl-4-carboxyethylpyrrole); poly(3-methyl-4-carboxybutylpyrrole); poly(3-hydroxypyrrole); poly(3-methoxypyrrole); poly(3-ethoxypyrrole); poly (3-butoxypyrrole); poly(3-hexyloxypyrrole); poly(3-methyl-4-hexyloxypyrrole); and poly(3-methyl-4-hexyloxypyrrole) and the like can be mentioned.

In addition to the above examples, the resistive film 3 may be made of a conductive organic polymer with a π-conjugated main chain. Examples of the conductive organic polymer include the following: polyacetylene conductive polymer; polyphenylene conductive polymer; polyphenylene vinylene conductive polymer; polyaniline conductive polymer; polyacene conductive polymer; polythiophene vinylene conductive polymer; and copolymers thereof.

The conductive organic polymer may be used in combination with polyanion as a counter anion. The polyanion is not particularly limited and may preferably contain an anion group with which the conjugated conductive organic polymer can be doped by chemical oxidation. Examples of the anion group include groups represented by the general formulas —O—$SO_3$X, —O—PO(OX)$_2$, —COOX, and —$SO_3$X (where X is a hydrogen atom or an alkali metal atom). Among them, the groups represented by —$SO_3$X and —O—$SO_3$X are particularly preferred because they have a high doping effect on the conjugated conductive organic polymer.

Specific examples of the polyanion include the following: polymers having a sulfonic acid group such as polystyrenesulfonic acid, polyvinylsulfonic acid, polyallylsulfonic acid, polyacrylsulfonic acid, polymethacrylsulfonic acid, poly(2-acrylamide-2-methylpropanesulfonic acid), polyisoprenesulfonic acid, polysulfoethyl methacrylate, poly(4-sulfobutyl methacrylate), and polymethacryloxybenzenesulfonic acid; and polymers having a carboxylic acid group such as polyvinylcarboxylic acid, polystyrenecarboxylic acid, polyallylcarboxylic acid, polyacrylcarboxylic acid, polymethacrylcarboxylic acid, poly(2-acrylamide-2-methylpropanecarboxylic acid), polyisoprenecarboxylic acid, and polyacrylic acid. Each of the polymers may be a homopolymer or a copolymer of two or more types of monomers. These polyanions may be used individually or in combination of two or more. Among them, the polymers having a sulfonic acid group are preferred, and the polystyrenesulfonic acid is more preferred.

The above examples of the conductive organic polymer may be used individually or in combination of two or more. Among them, one or two polymers selected from polypyrrole, poly(3-methoxythiophene), poly(3,4-ethylenedioxythiophene), poly(2-anilinesulfonic acid), and poly(3-anilinesulfonic acid) are preferred because of higher light transmittance and conductivity.

In particular, the combination of the conjugated conductive organic polymer and the polyanion is preferably a combination of poly(3,4-ethylenedioxythiophene: PEDOT) and polystyrenesulfonic acid (PSS).

The resistive film 3 may also contain a dopant in order to control the electric conductivity of the conductive organic polymer and to match the input impedance of the radio wave absorbing sheet 1 to the impedance of the air. Examples of the dopant include the following; halogens such as iodine and chlorine; Lewis acids such as $BF_3$ and $PF_5$; proton acids such as nitric acid and sulfuric acids transition metals; alkali metals; amino acids; nucleic acids; surfactants; pigments; chloranil; tetracyanoethylene; and TCNQ. More specifically, it is preferable that the surface resistance of the resistive film 1 is set to about plus or minus a few percent of 377Ω. In such a case, the mixing ratio of the conductive organic polymer to the dopant may be, e.g., 1:2 to 1:4 by mass.

Moreover, the resistive film 3 preferably contains polyvinylidene fluoride.

When the polyvinylidene fluoride is added to a mating composition containing the conductive organic polymer, the polyvinylidene fluoride functions as a binder to form a conductive organic polymer film. The addition of the polyvinylidene fluoride can improve the film forming properties and enhance the adhesion of the film to a base material.

Further, the resistive film 3 preferably contains water-soluble polyester. The water-soluble polyester is highly compatible with the conductive organic polymer. Therefore, when the water-soluble polyester is added to the coating composition containing the conductive organic polymer constituting the resistive film 3, the conductive organic polymer is immobilized in the resistive film 1 that becomes more homogeneous. The addition of the water-soluble polyester can reduce a change in the surface resistance of the resistive film 3 even in a more severe high-temperature and high-humidity environment, so that the impedance matching between the radio wave absorbing sheet and the air can be maintained.

The resistive film 3 containing the polyvinylidene fluoride and the water-soluble polyester has high weather resistance, and thus can reduce a change in the surface resistance over time. This makes the radio wave absorbing sheet more reliable to be able to maintain stable radio wave absorption properties.

The content of the conductive organic polymer in the resistive film 3 is preferably 10% by mass or more and 35% by mass or less with respect to the total mass of the solid content in the coating composition of the resistive film 3. If the content of the conductive organic polymer is less than 10% by mass, the conductivity of the resistive film 3 tends to be reduced. In this cask-, the surface resistance of the resistive film 3 can be adjusted within a predetermined range to achieve impedance matching. As a result, the thickness of the resistive film 3 will be increased to make the radio wave absorbing sheet thicker, which may degrade the optical properties such as light transmittance. On the other hand, if the content of the conductive organic polymer is more than 35% by mass, the mating suitability for the resistive film 3 will be reduced due to the structure of the conductive organic polymer. Thus, the resistive film 3 cannot be successfully formed and the haze of the resistive film 3 is increased, which may lead to poor optical properties.

As described above, the mating composition is used as a coating material to form the resistive film. The coating composition is applied to the base material and then dried, thus forming the resistive film 3.

The application of the coating material for forming the resistive film to the base material may be performed by, e.g., bar mating, reverse mating, gravure mating, micro-gravure coating, die mating, clip mating, spin coating, slit coating, or spray mating. The mated film may be dried so that the solvent component contained in the mating material is evaporated. The drying is preferably performed at 100 to 150° C. for 5 to 60 minutes. If the solvent remains in the resistive film 3, the strength of the film can be reduced. Examples of the drying method include a hot air drying method, a heat drying method, a vacuum drying method, and a natural drying method. Moreover, the mated film may be cured by UV (ultraviolet) or EB (electron beam) irradiation to form the resistive film 3, as needed.

The base material, on which the resistive film 3 is formed, is not particularly limited and is preferably a transparent base material with light transmittance. The transparent base material may be any material such as resin, rubber, glass, or ceramics.

In the radio wave absorbing sheet 1 of this embodiment, the conductive organic polymer is used to form the resistive film 3 having a predetermined surface resistance. This resistive film 3 can improve impedance matching with respect to the radio waves entering the radio wave absorbing sheet 1. Thus reflection and scattering of the radio waves from the surface of the radio wave absorbing sheet 1 can be reduced, resulting in better radio wave absorption properties.

(Dielectric Layer)

The dielectric layer 4 of the radio wave absorbing sheet 1 may be made of dielectric materials such as polyvinylidene fluoride, polyester resin, glass, transparent silicone rubber, and transparent OCA and OCR. The dielectric layer 4 may be either a single layer of one type of material or a multi-layer including two or more layers of the same or different types of materials. The dielectric layer 4 may be formed by, e.g., mating, press molding, or extrusion molding.

As described above, the radio wave absorbing sheet 1 is a radio interference type (λ/4 type) radio wave absorbing sheet. In the radio interference type radio wave absorbing sheet, the phase of the radio wave incident on the radio wave absorbing sheet 1 is shifted by half a wavelength relative to the phase of the radio wave reflected from the radio wave shielding layer, so that the incident wave and the reflected wave cancel each other out. Therefore, the thickness of the dielectric layer 4 (represented by d in FIG. 1) is determined in accordance with the wavelength of the radio waves to be absorbed.

The value d is λ/4 when there is a space between the resistive film 3 and the radio wave shielding layer 5, i.e., when the dielectric layer 4 is composed of air. However, the valued is $\lambda/(4(\sqrt{\varepsilon_r}))$ when the dielectric layer 4 is made of a material with a dielectric constant $\varepsilon_r$. In this ease, the thickness d of the dielectric layer 4 can be reduced by $1/\sqrt{\varepsilon_r}$ by using a material with a high dielectric constant to form the dielectric layer 4. Thus, the total thickness of the radio wave absorbing sheet 1 can be reduced. The radio wave absorbing sheet 1 of the radio wave absorber 10 of this embodiment has flexibility and can be more easily bent as the thickness of the dielectric layer 4 becomes smaller, which means that the radio wave absorbing sheet itself becomes thinner. In other words, the smaller the thickness, the higher the flexibility of the radio wave absorbing sheet 1. Considering that the radio wave absorbing sheet 1 is attached to the support member 2 with, e.g., the adhesive layer 6 (as will be described later), it is preferable that the radio wave absorbing sheet 1 is thin and easily conforms to the shape of the portion to be attached, and is also made lighter in weight.

The wavelength λ of the radio waves that are to be absorbed by the radio wave absorbing sheet 1 is $\lambda = d \times 4(\sqrt{\varepsilon_r})$, where $\varepsilon_r$ represents the dielectric constant of the dielectric material used for the dielectric layer 4 and d represents the thickness of the dielectric layer 4. The radio wave absorbing sheet 1 is designed to absorb the radio waves with a predetermined wavelength, i.e., the radio waves of a frequency (1/λ) by adjusting the dielectric constant $\varepsilon_r$ of the dielectric material and the thickness of the dielectric layer 4.

(Radio Wave Shielding Layer)

The radio wave shielding layer 5 of the radio wave absorbing sheet 1 of this embodiment is located on the opposite side of the radio wave absorbing sheet 1 and adjacent to the dielectric layer 4, and reflects radio waves incident from the resistive film 3.

In addition, the radio wave shielding layer 5 needs to be flexible so that it can be bent along with the bending of at least the resistive film 3 and the dielectric layer 4, and also needs to have light transmittance.

The radio wave shielding layer 5 that meets the above requirements may be a conductive mesh composed of conductive fibers. For example, the conductive mesh may be a polyester monofilament woven mesh that is coated with a metal, thereby having conductivity. The metal may be a highly conductive metal such as copper or silver. In order to reduce the reflection from the metal film covering the mesh surface, a black antireflective layer may be provided on the outer surface of the metal film. Such a conductive mesh has been brought to the market.

The radio wave shielding layer 5 made of the conductive mesh is configured to have a minimum thickness to ensure flexibility and light transmittance, provided that the surface resistance required for the radio wave shielding layer 5 can be obtained. If the fibers of the conductive mesh are damaged or cut, it is difficult to obtain the desired surface resistance. For this reason, a reinforcing layer and a protective layer that are composed of a transparent resin may be formed on the back of the conductive mesh. Thus, the radio wave shielding layer 5 may be a laminated body including a radio wave reflection portion made of a conductive material and a film portion made of resin.

(Adhesive Layer)

In the radio wave absorbing sheet 1 of this embodiment, the laminated body of the resistive film 3, the dielectric layer 4, and the radio wave shielding layer 5 can easily be attached to the surface of the support member 2 with the adhesive layer 6. In particular, the radio wave absorbing sheet 1 has flexibility and can easily be attached to even a curved surface of the support member 2. The presence of the adhesive layer 6 on the back of the radio wave shielding layer 5 can improve the ease of handling of the radio wave absorbing sheet 1.

The adhesive layer 6 may be made of any known materials used for adhesive layers of adhesive tapes or the like, including, e.g., an acrylic adhesive, a rubber adhesive, and a silicone adhesive. Moreover, a tackifier or a crosslinking agent may also be used to adjust the adhesion force to the support member 2 (adherend) or to reduce the adhesive residue. The adhesion force to the adherend is preferably 5 N/10 mm to 12 N/10 mm. If the adhesion force is less than 5 N/10 mm, the radio wave absorbing sheet is likely to be peeled off or displaced from the adherend. If the adhesion force is more than 12 N/10 mm, the radio wave absorbing sheet is less likely to be peeled off the adherend.

When the radio wave absorbing sheet 1 is removably attached to the support member 2, the adhesion force is preferably about 5 N/mm to 8 N/mm. In this range, it is possible to reattach the radio wave absorbing sheet 1 to the support member 2. Accordingly, the radio wave absorbing sheet 1 that was once attached to the support member 2 can be removed from it and then attached to another support member 2. This allows the radio wave absorbing sheet 1 to be recycled.

The thickness of the adhesive layer 6 is preferably 20 μm to 100 μm. If the thickness of the adhesive layer 6 is less than 20 μm, the adhesion force is reduced, and thus the radio wave absorbing sheet 1 is likely to be peeled off or displaced from the adherend. If the thickness of the adhesive layer 6 is more than 100 μm, the radio wave absorbing sheet 1 is less likely to be peeled off the support member 2. Further, if the cohesion of the adhesive layer 6 is small, an adhesive residue may be left on the support member 2 after the radio wave absorbing sheet 1 is removed. This may lead to a reduction in the flexibility of the radio wave absorbing sheet 1 as a whole.

The adhesive layer 6 may be used to removably or unremovably attach the radio wave absorbing sheet 1 to the support member 2. As described above, the adhesive layer 6 is not essential for the radio wave absorbing sheet 1. The radio wave absorbing sheet 1 can be attached to the surface of the support member 2 by various conventional bonding methods.

(Protective Layer)

In the radio wave absorbing sheet 1 of this embodiment, the protective layer 7 may be provided on the surface of the resistive film 3, on which radio waves are incident.

The surface resistance of the conductive organic polymer used for the resistive film 3 can be affected by humidity in the air. Thus, the presence of the protective layer 7 on the surface of the resistive film 3 is advantageous in reducing the influence of humidity and effectively preventing a reduction in the radio wave absorption properties resulting from impedance matching.

The protective layer 7 may be made of e.g., polyethylene terephthalate with a thickness of 25 μm. This layer may be bonded to the surface of the resistive film 3 with a resin adhesive.

The protective layer 7 covering the entire surface of the resistive film 3 can prevent the influence of humidity in the air on the resistive film 3. The surface resistance of the protective layer 7, which is formed as a resin film, may affect the surface resistance of the resistive film 3, since the resistance components of the protective layer 7 and the resistive film 3 are considered to be connected in parallel. Thus, the protective layer 7 may have little effect on the input impedance of the radio wave absorbing sheet 1 unless the thickness of the protective layer 7 is too large. Moreover, in view of the effect of the surface resistance of the protective layer 7, the surface resistance of the resistive film 3 can be set to a value that is more suitable as the input impedance of the radio wave absorbing sheet 1.

The protective layer 7 is preferably as thin as possible to the extent that it can protect the resistive film 3. Specifically, the thickness of the protective layer 7 is preferably 150 μm or less, and more preferably 100 μm or less. If the thickness of the protective layer 7 is more than 150 μm, the radio wave absorption performance is reduced, so that the amount of radio waves absorbed may be less than 20 dB. Further, the total thickness of the radio wave absorbing sheet 1 is increased, resulting in low flexibility.

Examples of Radio Wave Absorbing Sheet

Hereinafter, radio wave absorbing sheets for the radio wave absorber of this embodiment were actually produced and their various properties were measured. The results of the measurement will be described below.

<Weather Resistance of Resistive Film>

Five radio wave absorbing sheets were produced for each of the following two types that differ in components of a resistive film liquid used to form a resistive film.

(Sheet 1)

The following components were added and mixed together to prepare a resistive film liquid.

| (1) Conductive polymer dispersing element | 36.7 parts |
|---|---|

Conductive polymer (PEDOT-FSS) manufactured by Heraeus Holding: PH-100 (trade name), solid content concentration: 1.2% by mass

| (2) PVDF dispersion | 5.6 parts |
|---|---|

LATEX 32 (trade name) manufactured by Arkema S.A, solid content concentration: 20% by mass, solvent: water

| (3) Water-soluble polyester aqueous solution | 0.6 parts |
|---|---|

PLAS COAT Z561 (trade name) manufactured by GOO CHEMICAL CO., LTD., solid content concentration: 25% by mass

| (4) Organic solvent (dimethylsulfoxide) | 9.9 parts |
|---|---|
| (5) Watar-soluble solvent (ethanol) | 30.0 parts |
| (6) Water | 17.2 parts |

(Sheet 2)

The following components were added and mixed together to prepare a resistive film liquid.

| (1) Conductive polymer dispersing element | 33.7 parts |
|---|---|

Conductive polymer (PEDOT-PSS) manufactured by Heraeus Holding: PH-1000 (trade name), solid content concentration: 1.2% by mass

| (2) PVDF dispersion | 5.1 parts |
|---|---|

LATEX 32 (trade name) manufactured by Arkema S.A, solid content concentration: 20% by mass, solvent: water

| (3) Organic solvent (dimethylsulfoxide) | 9.5 parts |
|---|---|
| (4) Watar-soluble solvent (normal propyl alcohol) | 36.0 parts |
| (5) Water | 15.7 parts |

Each of the resistive film liquids thus prepared was applied to a polyethylene terephthalate sheet (base material) with a thickness of 25 μm by bar coating so that the thickness after drying was about 120 nm. Then, the applied liquid was heated at 150° C. for 5 minutes to form a resistive film. The resulting resistive films both had a surface resistance of 377 Ω/sq.

Urethane rubber with a thickness of 400 μm was used as a dielectric layer and an aluminum foil with a thickness of 15 μm was used as a radio wave shielding layer. The resistive film, the dielectric layer, and the aluminum foil were stacked in close contact with each other and bonded together with an adhesive.

(Test Condition)

The initial surface resistances of the radio wave absorbing sheets for the sheet 1 (n=5) and the sheet 2 (n=5) were measured, respectively. Next, all the radio wave absorbing sheets were placed in a constant temperature and high humidity chamber and stored at 60° C. and a relative humidity of 90% for 500 hours. Subsequently, the surface resistances of the resistive films of the radio wave absorbing sheets after storage were measured. The rate of change in the surface resistance of each of the radio wave absorbing sheets was determined by the formula: Rate of change in surface resistance (%)=[(Surface resistance after storage−Initial surface resistance)/Initial surface resistance]×100. The averages of these rates of change in the surface resistance for the sheet 1 (n=5) and the sheet 2 (n=5) were calculated, respectively.

As a result of the measurement, the average of the rates of change in the surface resistance of the five radio wave absorbing sheets (n=5) was 8% for the sheet 1 and 18% for the sheet 2. The rate of change in the surface resistance for the sheet 1 (8%) corresponds to about 30Ω with respect to 377Ω, which indicates that the sheet 1 has high stability in practical use, taking into account the strict weather resistance test conditions. Moreover, the rate of change in the surface resistance for the sheet 2 (18%) corresponds to about 68Ω with respect to 377Ω, which indicates that the sheet 2 has sufficient stability in practical use.

The results of the weather resistance test using the sheet 1 and the sheet 2 show that the addition of the water-soluble polyester aqueous solution to the resistive film allows the resistive film to have low hygroscopicity and cause only a small change in the surface resistance, and thus can provide the radio wave absorbing sheet with stable radio wave absorption properties.

<Effect of Impedance Matching>

Next, radio wave absorbing sheets (sheets 3 to 6) including resistive films with different surface resistances were actually produced to examine changes in the radio wave absorption properties due to a difference in the surface resistance between these resistive films.

(Production of Sheet)

All the radio wave absorbing sheets were produced in the following manner. First, the resistive film liquid used for the sheet 1 above was applied to a polyethylene terephthalate sheet (base material) with a thickness of 300 μm by bar crating so that the crating thickness varied from sheet to sheet. Then, the applied liquid was heated at 150° C. for 5 minutes to form a resistive film. Next, a polyethylene terephthalate sheet with a thickness of 250 μm was bonded to the surface of the base material facing away from the resistive film with an adhesive. Consequently, a polyethylene terephthalate dielectric layer 2 with a thickness of 550 μm was formed. Moreover, an aluminum foil with a thickness of 15 μm was used as a radio wave shielding layer 3. The center frequency of the radio waves absorbed by each of the radio wave absorbing sheets thus produced was 76 GHz.

In these radio wave absorbing sheets, the thickness and surface resistance of the resistive films after drying were as follows.

(Sheet 3) resistive film thickness: 140 nm, surface resistance: 320 Ω/sq (Sheet 4) resistive film thickness: 92 nm, surface resistance: 452 Ω/sq (Sheet 5) resistive film thickness: 15 nm, surface resistance: 302 Ω/sq (Sheet 6) resistive film thickness: 88 nm, surface resistance: 471 Ω/sq (Measurement of Radio Wave Absorption Properties)

The radio wave absorption properties of the sheets 3 to 6 along with the sheet 1 were measured by a free-space method. As described above, the sheet 1 was the radio wave absorbing sheet including the resistive film with a surface resistance of 377 Ω/sq, which was equal to the air impedance. Specifically, using a free space measuring device manufactured by KEYCOM Corporation and a vector network analyzer MS4647B (trade name) manufactured by ANRITSU CORPORATION, each of the radio wave absorbing sheets was irradiated with radio waves, and the ratio of the intensity of the reflected waves to the intensity of the incident waves was determined as a voltage value.

Figure 4:
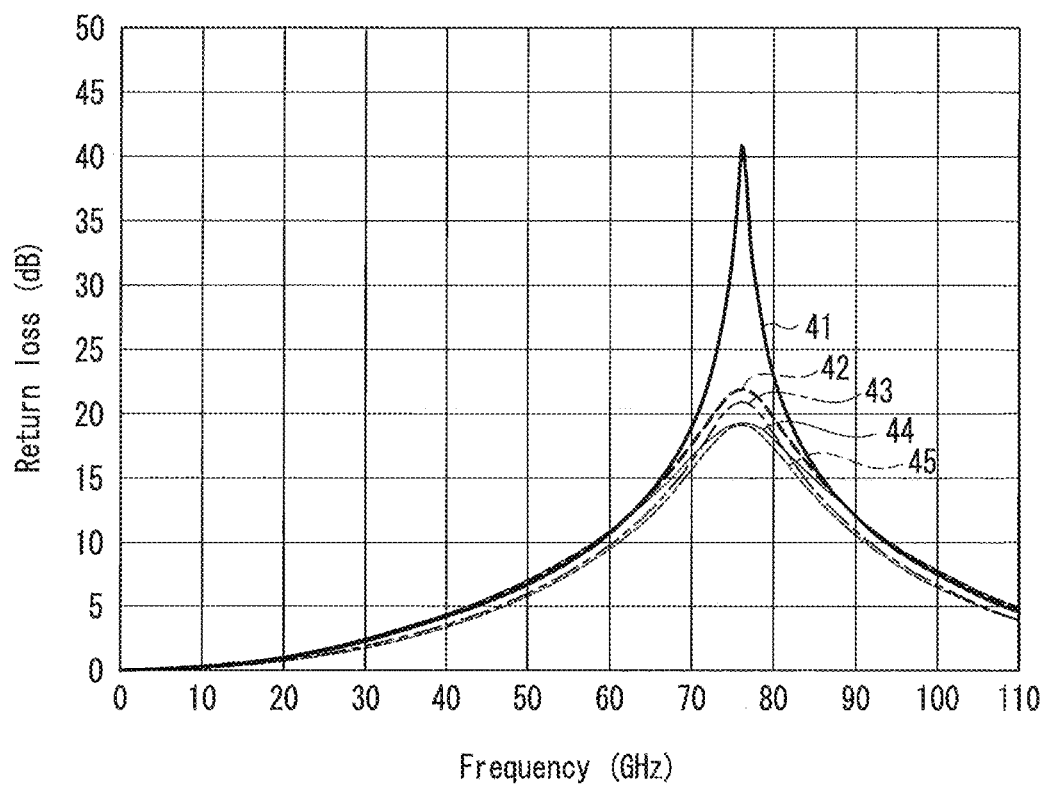
FIG. 4 is a diagram showing the radio wave absorption properties of the radio wave absorbing sheets that differ in the surface resistance of the resistive film.

FIG. 4 shows the radio wave absorption properties of each of the radio wave absorbing sheets thus measured. In FIG. 4, the attenuation of the intensity of the reflected waves with respect to the intensity of the incident waves is represented by dB.

In FIG. 4, reference numeral 41 indicates the radio wave absorption properties of the sheet 1, reference numeral 42 indicates the radio wave absorption properties of the sheet 3, reference numeral 43 indicates the radio wave absorption properties of the sheet 4, reference numeral 44 indicates the radio wave absorption properties of the sheet 5, and reference numeral 45 indicates the radio wave absorption properties of the sheet 6.

As can be seen from FIG. 4, the sheet 1 had a very high attenuation of about 42 dB at 76 GHz. This is because the surface resistance of the resistive film was 377 Ω/sq, which was equal to the air (vacuum) impedance, and thus extremely good impedance matching was achieved.

On the other hand, the sheet 3 had an attenuation of about 22 dB at 76 GHz. In the sheet 3, the surface resistance of the resistive film was 320 Ω/sq, which deviated by −15% from the vacuum impedance (377Ω). The sheet 4 had an attenuation of about 21 dB at 76 GHz. In the sheet 4, the surface resistance of the resistive film was 452 Ω/sq, which deviated by +20% from the vacuum impedance. Thus, both the sheet 3 and the sheet 4 had good radio wave absorption properties, since the attenuation was higher than 20 d R (attenuation factor 99%).

In contrast, the sheet 5 and the sheet 6 had an attenuation of about 19 d R at 76 GHz. In the sheet 5, the surface resistance of the resistive film was 302 Ω/sq, which deviated by −20% from the vacuum impedance (377Ω). In the sheet 6, the surface resistance of the resistive film was 471 Ω/sq, which deviated by +25% from the vacuum impedance. The attenuation of about 20 dB or more is considered to be suitable for the radio wave absorption properties of the radio wave absorbing sheet in a practical point of view. Therefore, the radio wave absorbing sheet with good radio wave absorption properties can be obtained by setting the surface resistance of the resistive film in the range of −15% to +20% of the vacuum impedance.

<Radio Wave Shielding Layer>

Next, a radio wave shielding layer with flexibility and light transmittance was examined.

A resistive film with a surface resistance of 377 Ω/sq was prepared based on the above production method of the sheet 1.

The resistive film liquid was applied to a polyethylene terephthalate sheet (base material) with a thickness of 10 μm by bar mating. Then, the applied liquid was heated at 150° C. for 5 minutes to form a resistive film. Next, a dielectric layer made of transparent silicone rubber with a thickness of 550 µm was formed on the surface of the base material facing away from the resistive film.

Further, a conductive mesh Su-4X-27035 (trade name) manufactured by SEIREN CO., LTD. was used to form a radio wave shielding layer, thus providing a radio wave absorbing sheet (sheet 7) of Example 1. Similarly, a conductive mesh Su-4G-9027 (trade name) manufactured by SEIREN CO., LTD. was used to form a radio wave shielding layer, thus providing a radio wave absorbing sheet (sheet 8) of Example 2.

On the other hand, a transparent conductive film PURE-OFT RN3000 (trade name) manufactured by FUJIMORI KOGYO CO., LTD. was used to form a radio wave shielding layer, thus providing a radio wave absorbing sheet (sheet 9) of Comparative Example.

In these radio wave absorbing sheets, the electrical and optical properties of the radio wave shielding layers were as follows.

(Sheet 7) surface resistance: 0.04 Ω/sq, total light transmittance: 30%, aperture ratio: 38%

(Sheet 8) surface resistance: 0.11 Ω/sq, total light transmittance: 66%, aperture ratio: 82%

(Sheet 9) surface resistance: 0.40 Ω/sq, total light transmittance: 77% or more The total light transmittance, the haze value, and the radio wave absorption properties of the three radio wave absorbing sheets thus produced were measured.

The total light transmittance and the haze value were measured in accordance with JIS K 7105 by using a haze meter NDH2000 (trade name) manufactured by NIPPON DENSHOKU INDUSTRIES CO., LTD. The light source was Light C.

The radio wave absorption properties of the sheets 7 to 9 were measured by the free-space method in the same manner as described above. Using the free space measuring device manufactured by KEYCOM Corporation and the vector network analyzer MS4647B (trade name) manufactured by ANRITSU CORPORATION, each of the radio wave absorbing sheets was irradiated with radio waves, and the ratio of the intensity of the reflected waves to the intensity of the incident waves was determined as a voltage value.

Figure 5:
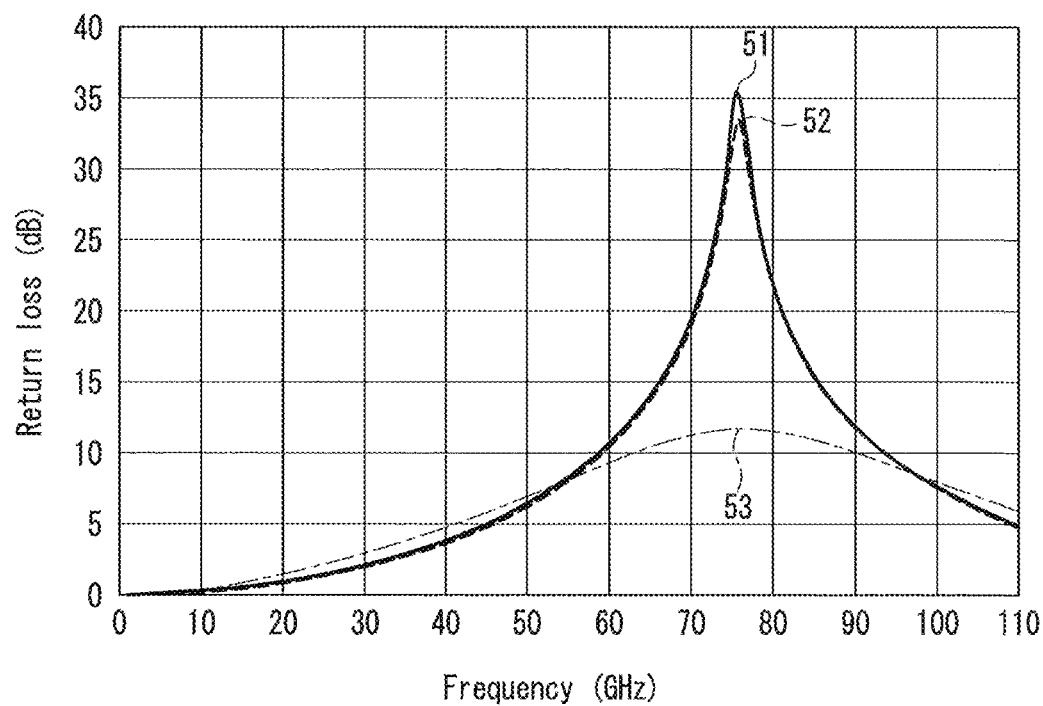
FIG. 5 is a diagram showing the radio wave absorption properties of the radio wave absorbing sheets that differ in the radio wave shielding layer.

FIG. 5 shows the radio wave absorption properties of each of the radio wave absorbing sheets thus measured. In FIG. 5, the attenuation of the intensity of the reflected waves with respect to the intensity of the incident waves is represented by dB.

In FIG. 5, reference numeral 51 indicates the radio wave absorption properties of the sheet 7, reference numeral 52 indicates the radio wave absorption properties of the sheet 8, and reference numeral 53 indicates the radio wave absorption properties of the sheet 9.

The optical properties of the radio wave absorbing sheets were as follows. The sheet 7 had a total light transmittance of 30% and a haze value of 40. The sheet 8 had a total light transmittance of 66% and a haze value of 7. The sheet 9 had a total light transmission of 77% and a haze value of 8.

The relationship between the aperture ratio and the surface resistance of the radio wave shielding layer was examined.

Figure 6:
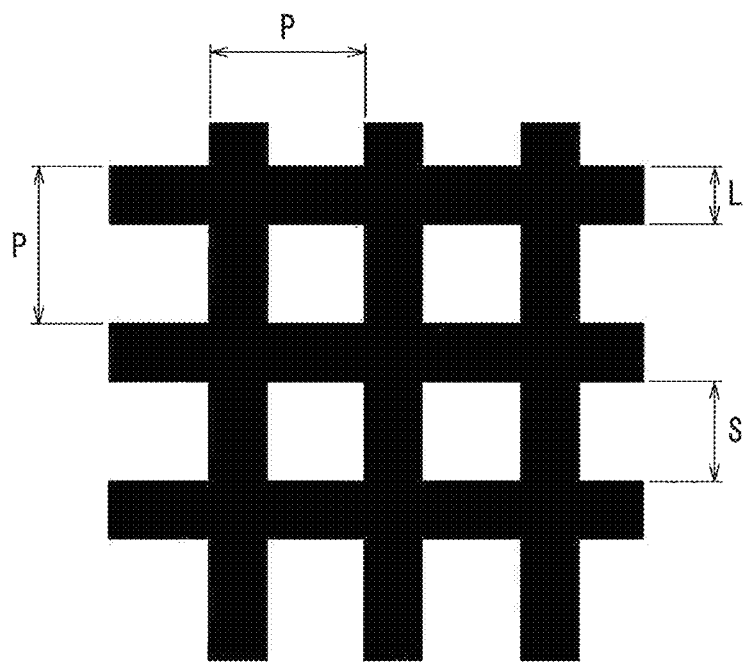
FIG. 6 is a model diagram illustrating the shape of a radio wave shielding layer used for the examination of an aperture ratio.

FIG. 6 is a model diagram illustrating the shape of a radio wave shielding layer used for the examination.

As illustrated in FIG. 6, the radio wave shieling layer was assumed to be a grid metal mesh of metal wires extending in the vertical and horizontal directions perpendicular to each other. The aperture ratio was calculated by changing the pitch P of the metal wires. Moreover, one square of the grid, which was defined by the metal wires (conductive member), was regarded as an inductor (coil) with a rectangular loop, and the conductivity of the metal mesh was calculated.

More specifically, the metal wire was assumed to have a diameter of 27 µm. In this case, the aperture ratio of the radio wave shielding layer is represented by the following formula (1), where pitch P=diameter L of wire+space S between wires.

[Formula 1]

$$\text{Aperture ratio} = \frac{S^2}{(S+L)^2} * 100 \qquad (1)$$

Assuming that the attenuation of radio waves incident on a plate-like radio wave shielding layer is expressed as shielding SE in dB, the shielding SE is given by the following formula (2), where Zo is the input/output impedance of the metal plate, σ ($\Omega^{-1} \cdot m^{-1}$) is the conductivity of the metal plate, and d (m) is the thickness of the metal plate.

[Formula 2]

$$SE = 20\log\left|\frac{2 + Z_0 \sigma d}{2}\right| \qquad (2)$$

When each square of the metal mesh is regarded as a coil, and the resistance value R=1/(σ·d) of the metal plate is replaced by jωL, the formula (2) can be converted to the following formula (3).

[Formula 3]

$$SE = 20\log\left|\frac{2 + \left(\frac{Z_0}{j\omega L}\right)}{2}\right| \qquad (3)$$

$$= 20\log\left|\frac{\sqrt{1 + \left(\frac{2\omega L}{Z_0}\right)^2}}{\left(\frac{2\omega L}{Z_0}\right)}\right|$$

Since ω=2πL, the radio wave shielding SE can be represented by the following formula (4).

[Formula 4]

$$SE = 20\log\left|\frac{\sqrt{1 + \left(\frac{4\pi f \cdot L}{Z_0}\right)^2}}{4\pi f\left(\frac{L}{Z_0}\right)}\right| \qquad (4)$$

The aperture ratio (formula (1)) and the shielding SE were determined by changing the pitch P of the wires of the metal mesh in the range of 30 µm to 500 µm. Then, it was found that the upper limit of the space between the wires was approximately 170 µm in order to achieve the shielding SE of 20 dB (corresponding to 99% attenuation) when the radio wave frequency was 60 to 90 GHz, as shown in Table 1 below. At this time, the aperture ratio was 75%, and the total light transmittance was 60%, taking into account the curvature of the wires.

On the other hand, the total light transmittance of the radio wave shielding layer should be 30% or more so that the radio wave absorbing sheet has light transmittance. To meet this requirement, the wire pitch P was 50 μm, the aperture ratio was 35%, and the shielding SE (i.e., the radio wave attenuation) was 45 d R.

TABLE 1

|  | Frequency 60 to 90 GHz | |
| --- | --- | --- |
| Pitch P of metal wires | 170 μm | 50 μm |
| Aperture ratio | 75% | 35% |
| Transmittance | 60% | 30% |
| Shielding SE | 21.2 dB | 45.0 dB |

According to the above results of examining the radio wave shielding effect of the radio wave shielding layer and the optical properties of the radio wave shielding layer of the sheet 7 and the radio wave shielding layer of the sheet 8, the aperture ratio is preferably 35% or more and 85% or less when the conductive mesh or the conductive grid is used as the radio wave shielding layer.

Moreover, based on the results of the sheet 9, the surface resistance is preferably 0.3 Ω/sq or less, and more preferably 0.11 Ω/sq or less to improve the radio wave reflection properties of the radio wave shielding layer. Further, the examination results show that the total light transmittance of the radio wave absorbing sheet is preferably 30% to 66%.

<Effect of Protective Layer>

Next, the effect of forming the protective layer on the surface of the resistive film was examined.

Using the above sheet 1, a radio wave absorbing sheet, i.e., a sheet 10 was produced, in which a polyethylene terephthalate sheet (protective layer) that had a thickness of 25 μm and was provided with an adhesive layer was bonded to the surface of the resistive film.

Two radio wave absorbing sheets were produced for each of the sheet 1 and the sheet 10, and a total of four sheets were subjected to a dry wiping and sliding test to determine the presence or absence of peeling of the sheet member on the surface and a change in the surface resistance. In the dry wiping and sliding test, a white flannel cloth was set in a sliding tester (HEIDON manufactured by Shinto Scientific Co., Ltd), and the measurement was performed under the following conditions: load 2000 g; sliding speed 4500 mm/min; sliding width 25 mm; and the number of repeated sliding motions 1000 passes (for about 10 minutes). The results confirmed that no visible peeling was observed on both the two radio wave absorbing sheets for the sheet 1 and the sheet 10, respectively. On the other hand, although the sheet 10 with the protective layer did not have any change in the surface resistance of the resistive film, the surface resistances of the two sheets of the sheet 1 without the protective layer increased by 16% and 10%, respectively. Such an increase in the surface resistance would be attributed to a decrease in the thickness of the resistive film due to scraping during the sliding test in the absence of the protective layer. Thus, the protective layer was able to protect the surface of the resistive film and reduce a change in the surface resistance.

The degree of increase in the surface resistance (10%, 16%) as a result of the sliding test does not significantly affect the radio wave absorption properties (i.e., the radio wave attenuation), as described above. Considering the practical aspect of the radio wave absorbing sheet, however, it is important to avoid the situation where the surface resistance of the resistive film is changed to interfere with the impedance matching, which may lead to poor radio wave absorption properties. Therefore, the use of the protective layer is preferred to reduce a change in the thickness of the resistive film due to mechanical factors and to provide the radio wave absorbing sheet with stable radio wave absorption properties.

<Confirmation of Flexibility>

Next, the flexibility of the radio wave absorbing sheet of this embodiment that includes the resistive film made of the conductive organic polymer was confirmed.

As a comparative example, a radio wave absorbing sheet, i.e., a sheet 11 was produced, in which a resistive film was formed by sputtering indium tin oxide (ITO) so that the surface resistance was 370 Ω/sq. The dielectric layer and the radio wave shielding layer of the sheet 11 were the same as those of the sheet 1.

The sheet 1 and the sheet 11 were each cut into a size of 5×10 cm, and the initial surface resistances of these sheets were measured. Next, aluminum cylindrical rods (mandrels) with six different diameters of 10 mm, 8 mm, 6 mm, 4 mm, 2 mm, and 0.5 mm were horizontally arranged. The sheet 1 and the sheet 11 were wrapped around each of the cylindrical rods with the resistive film facing outward, respectively. A 300 g weight was attached to both ends of each sheet and held for 30 seconds. Then, both ends of each sheet were pulled downward while the central portion of the sheet was being bent. Thereafter, the surface resistance of each of the radio wave absorbing sheets was measured again.

Table 2 shows the measurement results.

TABLE 2

| Diameter of cylindrical rod | 0.5 mm | 2 mm | 4 mm | 6 mm | 8 mm | 10 mm |
| --- | --- | --- | --- | --- | --- | --- |
| Resistive film | PEDOT | PEDOT | PEDOT | PEDOT | PEDOT | PEDOT |
| Surface resistance of resistive film after being wrapped around cylindrical rod | 370 Ω | 370 Ω | 370 Ω | 370 Ω | 370 Ω | 370 Ω |
| Surface condition | Unchanged | Unchanged | Unchanged | Unchanged | Unchanged | Unchanged |
| Resistive film | ITO | ITO | ITO | ITO | ITO | ITO |
| Surface resistance of resistive film after being wrapped around cylindrical rod | ∞ | ∞ |  | 750 Ω/sq |  | 370 Ω |
| Surface condition | Many cracks were present. | Many cracks were present. |  | Some cracks were present. |  | Unchanged |

When the diameter of the cylindrical rod was 10 mm, the sheet 1 and the sheet 11 did not have any change in the surface resistance of the resistive film. When the diameter of the cylindrical rod was 6 mm, the surface resistance of the sheet 1 was not changed, but the surface resistance of the sheet 11 was increased to 750 Ω/sq, which was about twice as high as the initial surface resistance. Thus, the surface condition of the radio wave absorbing sheet was changed if the surface resistance after the sheet had been wrapped around the cylindrical rod exceeded twice the initial surface resistance.

Further, when the diameter of the cylindrical rod was as small as 2 mm or 0.5 mm, the surface resistance of the sheet 1 was not changed, but the surface resistance of the sheet 11 was infinite, and thus the resistive film could not be used.

The surface condition of the radio wave absorbing sheet that was wrapped around the cylindrical rod with a diameter of 6 mm was observed with a microscope. Consequently, no change was seen in the sheet 1, but some cracks were present in the surface of the sheet 11. Moreover, the surface condition of the radio wave absorbing sheet that was wrapped around the cylindrical rod with a diameter of 0.5 mm was observed with a microscope. Consequently, no change was seen in the sheet 1, but there were more cracks in the sheet 11 than those in the sheet 11 that was wrapped around the cylindrical rod with a diameter of 6 mm.

The results confirmed that the use of the conductive organic polymer for the resistive film improved the flexibility of the radio wave absorbing sheet, and thus was able to maintain the radio wave absorption properties even if a load was applied to the sheet so that it was strongly bent with a small diameter. In this case, the radio wave absorbing sheet was found to be resistant to crack and sufficiently flexible, provided that the surface resistance measured by a flexibility test was not more than twice the initial surface resistance. In the flexibility test, the sheet was wound around the cylindrical rod with a diameter of 0.5 mm, and a 300 g weight was attached to both ends of the sheet and held for 30 seconds.

[Effect and Modified Example of Radio Wave Absorber]

As described above, the radio wave absorber of this embodiment has good radio wave absorption properties, high flexibility, and light transmittance such that the other side of the radio wave absorber is visible through it. Therefore, when the radio wave absorber is used particularly to measure the radio wave properties, it absorbs unwanted radio waves that would be measurement noise, so that the measurement accuracy can be improved.

In the measurement system of this embodiment, the radio wave absorber is placed on the back side of the measuring target device as viewed from the measuring device, that is, the radio wave absorber is positioned on the opposite side of the measuring target device to the measuring device. This arrangement can create a region where no unwanted radio waves are present around the measuring target device, and thus can improve the measurement accuracy. Moreover, since the measurement can be visually observed through the radio wave absorber, the radio wave absorber may be located close to the measuring target device, and the radio wave properties can be measured while the measurement state is being checked.

The present inventors confirmed the radio wave absorption properties of the radio wave absorber of this embodiment as follows.

Figure 7:
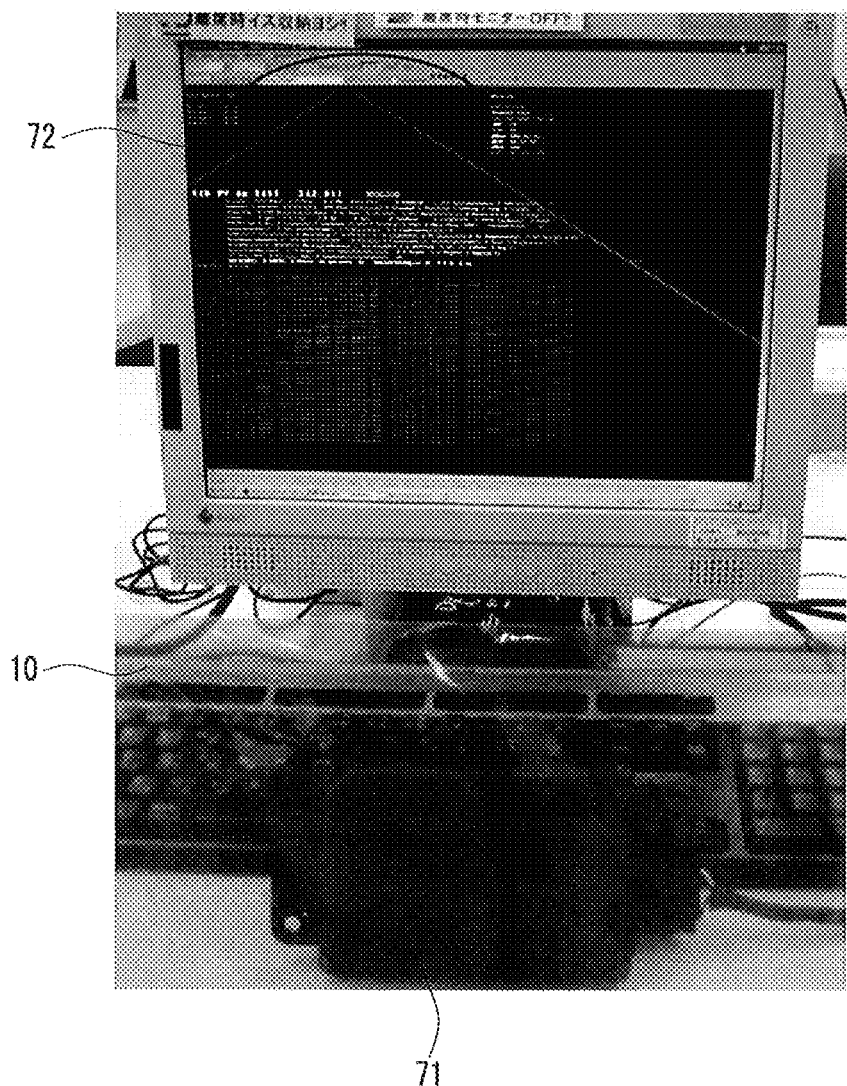
FIG. 7 is a diagram showing the radio wave absorption properties of the radio wave absorber of this embodiment.
Figure 8:
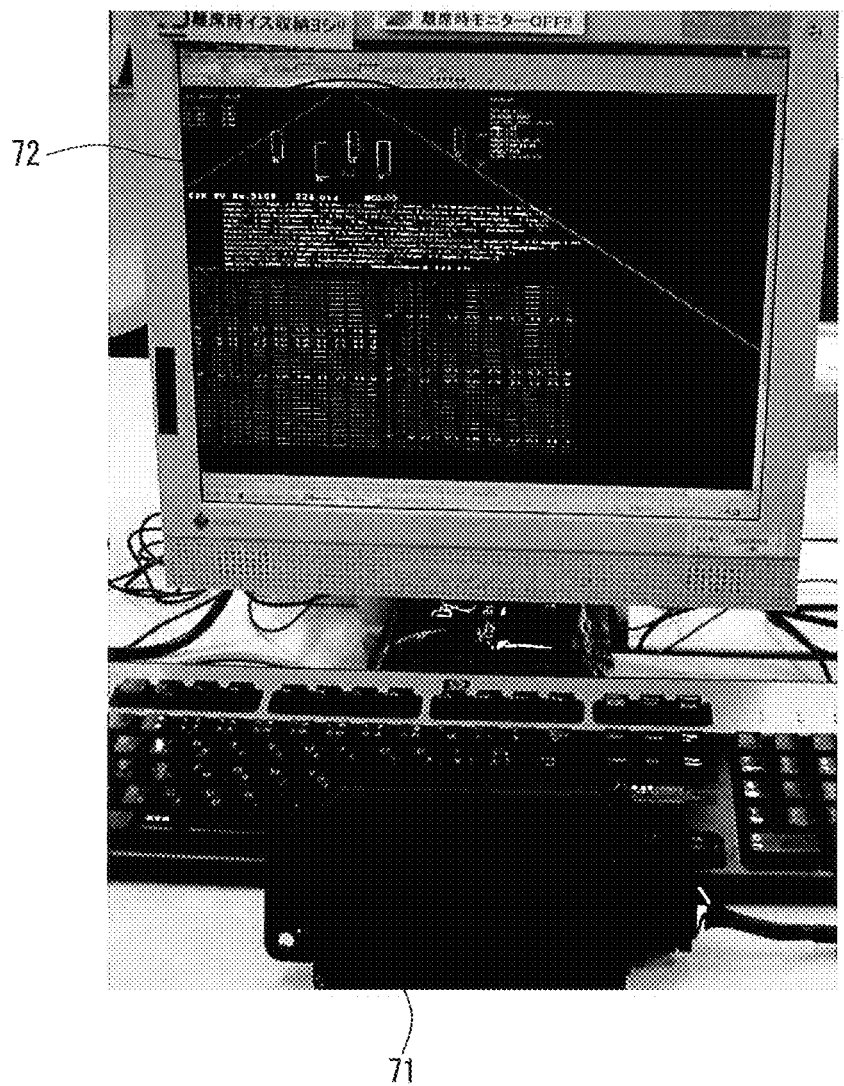
FIG. 8 is a diagram showing the radio wave properties as a comparative example in which the radio wave absorber of this embodiment is not used.

FIGS. 7 and 8 are diagrams showing the experiments for confirming the radio wave absorption properties of the radio wave absorber of this embodiment. FIG. 7 represents an example in which the radio wave absorber is used. FIG. 8 represents a comparative example in which the radio wave absorber is not used.

As shown in FIGS. 7 and 8, a millimeter wave radar 71 (product name: DEL-ESR-21 manufactured by Delphi) using radio waves of 76 GHz was placed so that radar waves were emitted toward the front.

A radio wave absorber 10 was produced in the following manner and used to determine the radio wave absorption effect. First, a transparent acrylic plate with a height of 250 mm, a width of 500 mm, and a thickness of 3 mm was prepared as a support member. Then, a metal mesh of blackened copper, a dielectric layer (silicone OCA) with a thickness of 500 μm, a PEDOT layer (about 350Ω) formed by mechanical mating, and a PET layer (protective layer) with a thickness of 50 μm were stacked in this order on the surface of the support member via an adhesive layer with a thickness of 50 μm. The absorption peak wavelength of the radio wave absorbing sheet was set to 76 GHz. The total light transmittance of the radio wave absorber 10 was 60%.

As shown in FIG. 7, the radio wave absorber 10 was located opposite the radar wave emission surface of the millimeter wave radar 71 with a space (about 30 mm) between them. On the other hand, as shown in FIG. 8, the radio wave absorber 10 was not provided in the comparative example.

When the millimeter wave radar 71 detected an obstacle that was to be placed forward of it (near the front of FIGS. 7 and 8), the state of the obstacle was displayed on the computer screen with special software (LeafLight v2 manufactured by Kvaser).

In FIG. 7, the radio wave absorber 10 was positioned in front of the millimeter wave radar 71, and no obstacle was displayed in a display area 72 on the screen of the computer connected to the measuring device. This indicates that the millimeter wave radar 71 did not detect an obstacle that was on the front side of the radio wave absorber 10 because the radar waves had been absorbed by the radio wave absorber 10. In contrast, in FIG. 8, the radio wave absorber 10 was not provided, and a plurality of vertically oriented rectangles were displayed in the display area 72 on the screen of the same computer. This indicates that the millimeter wave radar 71 detected the people who were doing the experiment and were near the front of FIG. 8. Thus, the millimeter wave radar 71 operated normally and detected the obstacle that was placed forward of the radar wave emission surface.

As described above, the radio wave absorber 10 of this embodiment can absorb the radio waves emitted from the millimeter wave radar 71. Moreover, as is evident from FIG. 7, due to high light transmittance of the radio wave absorber 10, the state of the millimeter wave radar 71, which is on the other side of the radio wave absorber 10, can be visually observed through the radio wave absorber 10.

In this embodiment, the radio wave absorber 10 is in the form of a plate, and the radio wave absorbing sheet 1 is attached to the plate-like support member 2. However, the radio wave absorber 10 is not limited to a plate shape. In particular, when the radio wave absorber 10 is used in the measurement system, it preferably has a shape that allows the measuring device 12 not to detect unwanted radio waves that would be noise components during the measurement of the radio wave properties.

FIG. 9 is an image diagram illustrating an example of different shapes of the radio wave absorbers of this embodiment.

Figure 9A:
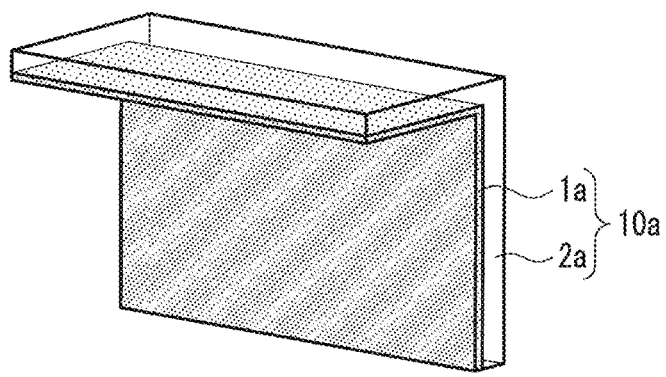
FIG. 9 is an image diagram illustrating a configuration example of the radio wave absorber of this embodiment.

FIG. 9A shows a radio wave absorber having a vertical portion and a horizontal portion that extends forward from the upper end of the vertical portion.

When the measuring target device is located just in front of a radio wave absorber 10a shown in FIG. 9A the radio wave absorber 10a can absorb unwanted radio waves that radiate upward as well as toward the sides or back of the measuring target device. Similarly, the radio wave absorber 10a can also absorb unwanted radio waves that enter from above as well as from the sides or back of the measuring target device. Moreover, the measuring target device can be visually observed from above because of the light transmittance of the radio wave absorber 10*a* In the radio wave absorber 10*a* of this embodiment, a radio wave absorbing sheet 1*a* is attached to the inner surface (corresponding to the front surface of the vertical portion and the lower surface of the horizontal portion) of a support member 2*a* having a substantially L-shaped cross section. As described above, the radio wave absorbing sheet 1*a* has flexibility and therefore may be attached to the inner surface of the support member 2*a* after the formation of the support member 2*a* with a vertical surface and a horizontal surface. Needless to say, two plate-like radio wave absorbers 10, in each of which the radio wave absorbing sheet 1 is attached to one surface of the plate-like support member 2, may be combined to form the radio wave absorber 10*a* as shown in FIG. 9A.

Figure 9B:
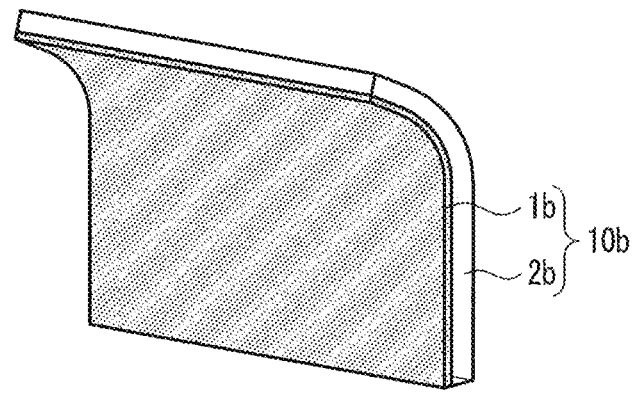

FIG. 9B shows a radio wave absorber having a vertical portion and a convex curved portion that curves forward from the upper end of the vertical portion.

In a radio wave absorber 10*b* shown in FIG. 9B, a radio wave absorbing sheet 1*b* is attached to the inner surface (front surface) of a support member 2*b* with a vertical surface and a curved surface which are continuously formed. Like the radio wave absorber 10*a* shown in FIG. 9A the radio wave absorber 10*b* can absorb unwanted radio waves that radiate upward, so that the radio wave properties can be measured with a high S/N ratio. Moreover, the measurement state can be visually observed from above and behind. The radio wave absorber 10*b* can easily be produced by, e.g., attaching the flexible radio wave absorbing sheet 1*b* to the inner surface of the support member 2*b* using an adhesive layer or an adhesive.

Figure 9C:
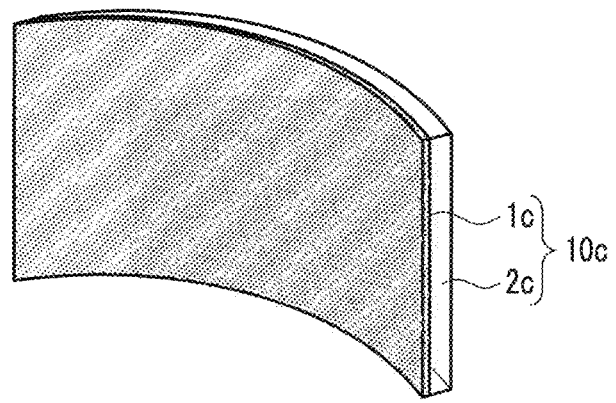

FIG. 9C shows a radio wave absorber having a horizontally curved portion.

In a radio wave absorber 10*c* shown in FIG. 9C, a radio wave absorbing sheet 1*c* is attached to the inner surface (front surface) of a support member 2*c* that is curved only in the horizontal direction and has a predetermined height. The radio wave absorber 10*c* can absorb unwanted radio waves that radiate toward the sides, among the radio waves emitted from the front, so that the radio wave properties can be measured with a high S/N ratio. Similarly, the radio wave absorber 10*c* can absorb unwanted radio waves that enter from the sides, so that the radio wave properties can be measured with a high S/N ratio. Moreover, the measurement state can be visually observed from both sides and behind. The radio wave absorber 10*b* can easily be produced by, e.g., attaching the flexible radio wave absorbing sheet 1*c* to the inner surface of the support member 2*c* using an adhesive layer or an adhesive.

When the support members 2*a*, 2*b*, and 2*c* are made of a deformable material, the radio wave absorbers 10*a*, 10*b*, and 10*c* can be deformed into the respective shapes shown in FIGS. 9A 9B, and 9C after the radio wave absorbing sheets 1*a*, 1*b*, and 1*c* have been attached to the support members 2*a*, 2*b*, and 2*c*, respectively. The shape of the radio wave absorber 10 can be changed to a predetermined shape even after its completion. Thus, the radio wave absorber 10 can respond flexibly to the measurement situation and have a desired shape accordingly.

In the radio wave absorber of this embodiment, the radio wave absorbing sheet has flexibility and can be attached to the support member that is formed into a desired shape having a flat surface, a bent surface, and a curved surface as a whole or in part. Therefore, the radio wave absorber may have a shape that is able to absorb unwanted radio waves that would occur during the measurement of the radio wave properties.

In FIG. 9, the radio wave absorbers cover either the top or the sides of the measuring target device. Needless to say, the radio wave absorber may be configured to cover two or more of the top, the left side, and the right side of the measuring target device. For example, the radio wave absorber 10*a* shown in FIG. 9A may further include side walls that extend forward from the left and right ends of the vertical portion, resulting in a box-like radio wave absorber with the front and bottom left open. This radio wave absorber can absorb unwanted radio waves traveling not only upward, but also in the left and right directions.

Figure 10A:
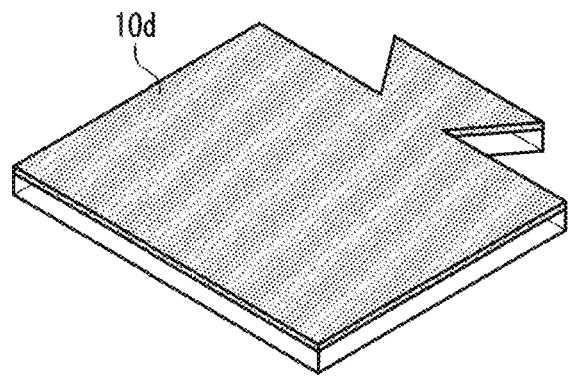
FIG. 10 is an image diagram illustrating another configuration example of the radio wave absorber of this embodiment.
Figure 10B:
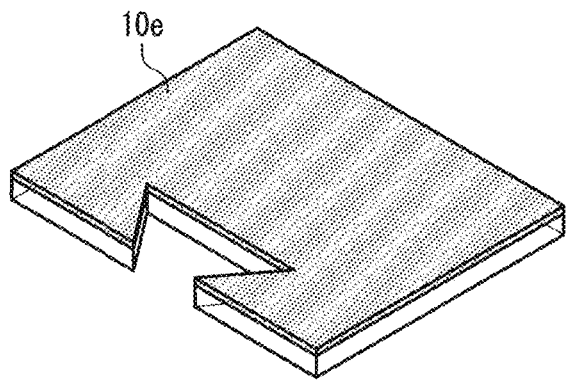

FIG. 10 is an image diagram illustrating another example of the shape of the radio wave absorber of this embodiment.

Figure 10C:
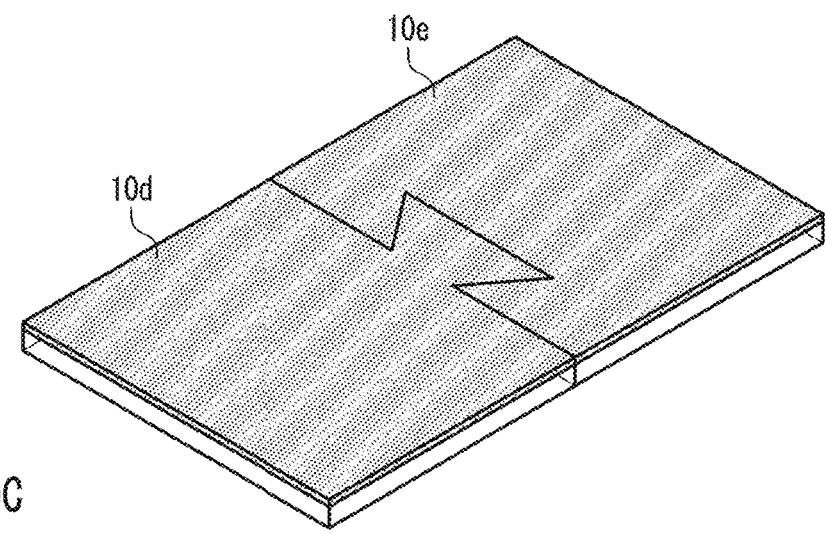

The radio wave absorber shown in FIG. 10 includes a first radio wave absorber 10*d* and a second radio wave absorber 10*e*. The first radio wave absorber 10*d* is in the form of a substantially rectangular plate and has a substantially triangular projection that protrudes from one side. The second radio wave absorber 10*e* is in the form of a substantially rectangular plate and has a substantially triangular recess that is provided in one side. The projection of the first radio wave absorber 10*d* and the recess of the second radio wave absorber 10*e* can be fitted together. As shown in FIG. 10C, two types of the radio wave absorbers 10*d*, 10*e* can be combined and fixed to from a radio wave absorber with a larger area.

As described above, in another example of the radio wave absorber of this embodiment, a radio wave absorber has a projection on the side and another radio wave absorber has a recess on the side, and the projection and the recess of two radio wave absorbers can be fitted together. This configuration allows a plurality of radio wave absorbers to be fitted to each other, and thus can provide a radio wave absorber with a larger area.

In FIG. 10, the first radio wave absorber 10*d* having a projection on one side and the second radio wave absorber 10*e* having a recess on one side are fitted to each other. For example, a radio wave absorber that is substantially rectangular in a plan view may have projections on two or four sides and another radio wave absorber that is substantially rectangular in a plan view may have recesses on two or four sides, and the projections and the recesses of two or more radio wave absorbers can be fitted together. Thus, a plurality of radio wave absorbers can be connected to each other in a block fashion. By using a plurality of radio wave absorbers that can be fitted to each other, it is possible to provide a radio wave absorber having a size and a shape as required. Moreover, if not necessary, the radio wave absorber can be separated into the individual radio wave absorbers, which can then be stored compactly and carried easily. In FIG. 10, two radio wave absorbers 10*d*, 10*e* that can be fitted to each other are combined to form a planar radio wave absorber with a larger area. Depending on the shape of the fit between the two radio wave absorbers, they may be combined three-dimensionally to be orthogonal to each other. In this manner, a plurality of planar radio wave absorbers may be combined to form, e.g., the radio wave absorber 10*a* with a vertical surface and a horizontal surface (see FIG. 9A).

The radio wave absorber of this embodiment is produced by attaching the radio wave absorbing sheet to the support member. Therefore, it is easier to produce a plurality of small radio wave absorbers than to produce a large radio wave absorber. For this reason, it is preferable that a plurality of radio wave absorbers that are configured to be fitted to each other are combined to form a radio wave absorber with a larger area, regardless of whether it is two-dimensional or three-dimensional.

In order to allow a plurality of radio wave absorbers to be fitted to each other, a certain tolerance is required for the shape of the fit between the radio wave absorbers. Thus, in a microscopic sense, there will exist a portion where the radio wave absorber (particularly the radio wave absorbing sheet) is not present. However, the present inventors confirmed that even a very small linear gap such as a boundary portion between the radio wave absorbers caused neither a significant reduction in the radio wave absorption properties nor a practical problem.

[Radio Wave Shielding Member]

Next, a specific example of a radio wave shielding member, which is a second configuration example of the measurement system of the present disclosure, will be described as an embodiment.

The radio wave shielding member of this embodiment has the properties of the radio wave absorber of the present disclosure. The radio wave absorber includes a transparent support member and a radio wave absorbing sheet with flexibility and light transmittance. The radio wave absorbing sheet is attached to the support member. The radio wave shielding member includes a housing that constitutes the outer shell of the radio wave shielding member and houses a measuring device and a measuring target device. At least a portion of the housing is transparent, and the radio wave absorbing sheet used for the radio wave absorber is attached to this transparent portion. In other words, the radio wave shielding member is a container member that houses the measuring device and is able to shield it from unwanted radio waves. Moreover, the radio wave absorber of the above embodiment forms at least a part of the sides and the top of the radio wave shielding member. The portion of the radio wave shielding member where the radio wave absorber is not used should be composed of a predetermined material that can prevent external unwanted radio waves from entering the container member.

Figure 11:
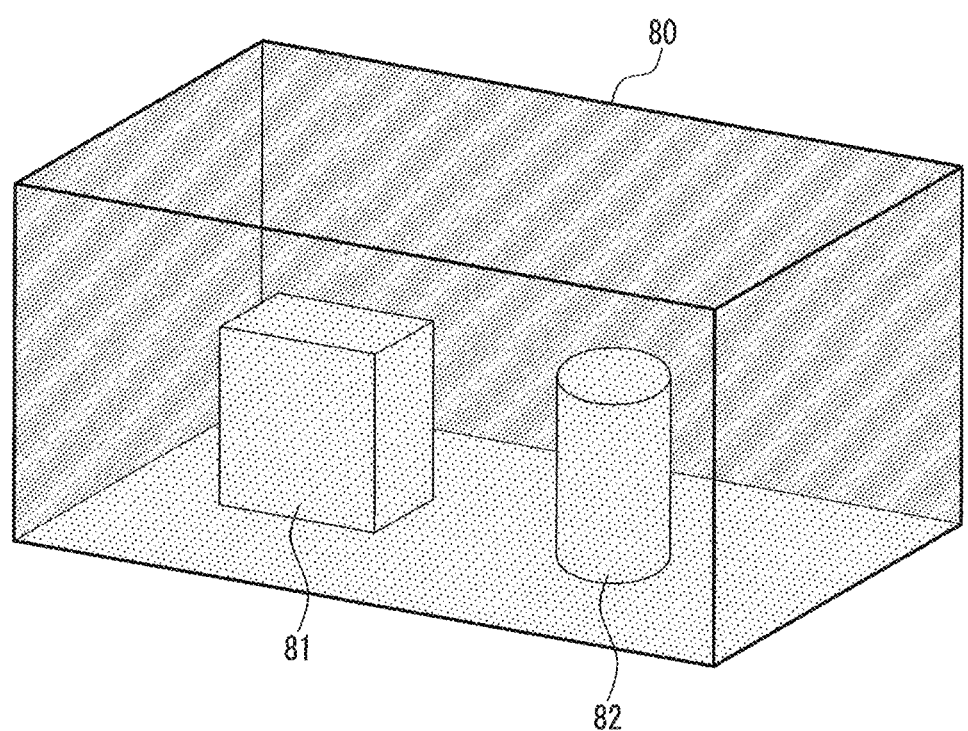
FIG. 11 is an image diagram illustrating a state in which the radio wave properties of a transmitter and a receiver are measured using the radio wave shielding member of this embodiment.

FIG. 11 is an image diagram illustrating a state in which the radio wave properties are measured using the radio wave shielding member of this embodiment.

A radio wave shielding member 80 shown in FIG. 11 includes a substantially box-like housing having a top and four sides made of an acrylic plate with high transparency. The radio wave absorbing sheet used for the radio wave absorber of the above embodiment is attached to the inner surface of the housing. In other words, the plate-like radio wave absorber forms the top and the four sides of the radio wave shielding member 80.

For example, when the radio wave properties (reception characteristics) of a receiver 82 is measured, the receiver 82 (i.e., the measuring target device) is placed in the radio wave shielding member 80 along with a transmitter 81, which is the transmission source of radio waves. Then, the radio waves transmitted from the transmitter 81 are compared to the radio waves received by the receiver 82. In this case, since the sides and the top of the radio wave shielding member 80 have light transmittance, the transmitter 81 and the receiver 82 can be directly visually observed during the measurement of the radio wave properties, as shown in FIG. 1. This configuration eliminates the need of a picture recorder such as a camera, which has been conventionally used to measure the radio wave properties inside the anechoic chamber, even if the radio wave properties are to be measured while checking the state of the measuring target device. Thus it is possible to avoid an increase in radio wave noise caused by the equipment for checking the state in the anechoic chamber, and also to save the trouble of adding a noise shielding member.

The radio wave shielding member 80 of this embodiment can easily be produced by, e.g., attaching the radio wave absorbing sheet with flexibility and light transmittance to the inner surface of the box-like housing made of the transparent support member. Therefore, it is easy to provide the radio wave shielding member having a shape and a size in accordance with, e.g., the measuring target device, the measuring device, and the measurement conditions.

For example, when the radio wave properties of a small device such as an on-board radar are measured, the housing is configured to have a size large enough to accommodate the measuring target device and the measuring device for measuring the radio wave properties. In this case, the radio wave absorbing sheet may be attached to the inner surface of the housing, so that the radio wave shielding member can be obtained. When a large measurement space such as the conventional anechoic chamber is required, the housing may be configured to have a sing that is comparable to the measurement chamber, and the radio wave absorbing sheet may be attached to the inner surface of the housing, resulting in the radio wave shielding member with a measurement space of a desired sin-.

In the radio wave shielding member of this embodiment, the radio wave absorbing sheet has high flexibility and can easily be attached to the inner surface of the transparent support member of the housing. In particular, when the housing has a curved surface, the radio wave absorbing sheet can be attached to the housing without leaving any gap between them, taking advantage of its flexibility. Further, the radio wave absorbing sheet can also be attached to the top, the sides, and the boundary portion between two surfaces (e.g., the adjacent sides), which are substantially perpendicular to each other, of the housing with a minimum gap between them. When the area of the housing is large, a plurality of radio wave absorbing sheets may be attached to the housing so that the gap is as small as possible. Thus, the walls and ceiling of the large radio wave shielding member can be covered with the radio wave absorbing sheet. As described above, the present inventors confirmed that if the boundary portion between two surfaces or the gap that occurred when a plurality of radio wave absorbing sheets were attached next to each other was about 2 to 3 mm or less, the radio wave shielding member was able to exhibit sufficient shielding properties against radio waves traveling from the inside to the outside or vice versa of the radio wave shielding member, and thus there was no practical problem.

As described above, the radio wave shielding member of this embodiment makes the inside visible, and further can easily be formed into a desired shape and size. These are significant advantages over the conventional anechoic chamber in which a radio wave absorber coated with a carbon material is applied to the inner surface of a metal shield body.

The radio wave shielding member has two types of configurations; (i) the bottom is also covered with the radio wave absorber; (ii) the bottom is not covered with the radio wave absorber, and the reflection of radio waves from the ground (earth) is taken into consideration. In the radio wave shielding member 80 shown in FIG. 11, the bottom is open. Accordingly, at the time of the measurement, the transmitter 81 and the receiver 82 are located in their predetermined positions, and then the radio wave shielding member 80 is put over them.

On the other hand, when the radio wave shielding member is configured to have the bottom covered with the radio wave absorber, the radio wave absorbing sheet is attached to the base material that constitutes the bottom, so that six surfaces of the radio wave shielding member are composed of the radio wave absorber. In particular, when the measuring target device is placed on, e.g., a metal table, the radio wave shielding member should have the bottom, to which the radio wave absorbing sheet is attached, in order to prevent reflection from the metal surface. In this case, it may not be necessary to visually observe the inside of the radio wave shielding member from underneath. Therefore, the support member that constitutes the bottom does not necessarily need to be transparent. The radio wave shielding member without the bottom may also be used in the measurement of the radio wave properties when the measurement target device is placed on, e.g., a table with the top made of a material that neither transmits nor reflects radio waves.

A material with excellent moldability such as an acrylic plate may be used to form the housing. For example, the top and at least one side of the housing, or the partial or whole circumference of the sides of the housing surrounding the sides of the measuring target device can be formed by bending a single acrylic plate. In this case, the radio wave absorbing sheet used as the radio wave absorber of the radio wave shielding member has high flexibility and can easily be attached to the inside of the curved surface of the transparent housing.

On the other hand, a plate-like member may be used to form the top and the four sides of the housing separately, and then these parts may be joined together. In this case, the boundary portion between the surfaces (i.e., the bonded portion) may not have to be highly transparent. Therefore, any adhesive or solvent can be used. Moreover, the housing may be formed by using flames made of various materials including metal, and fitting five base materials into each of the frames to define the respective surfaces of the housing. In this case, there are two ways of attaching the radio wave absorbing sheet. Specifically, the radio wave absorbing sheet may be attached to the individual base materials constituting the top and the four sides of the housing, and then these base materials may be bonded to each other to form the entire shape. Alternatively, the base materials may be joined to from the housing in advance, and then the radio wave absorbing sheet may be attached to the inner surface of the housing, taking advantage of its high flexibility.

As described above, the radio wave absorbing sheet used for the radio wave shielding member has high flexibility and is able to maintain the radio wave absorption properties even if it is strongly bent, since the resistive film is made of the conductive organic polymer and arranged on the radio wave incident side, and the radio wave shielding layer is made of the conductive mesh. Moreover, the housing that constitutes the outer shell of the radio wave shielding member is made of a transparent member. In addition, the resistive film, the dielectric layer, and the radio wave shielding layer are all made of a transparent member, and thus the radio wave absorbing sheet has light transmittance, e.g., a total light transmittance of 60% or more as a whole. This configuration can make the inside of the radio wave shielding member easily visible from the outside.

As in the case of the radio wave absorber of the present disclosure, the total light transmittance of each portion of the radio wave shielding member, including the housing corresponding to the support member, is set to 30% or more. This configuration can ensure sufficient visibility of the inside of the radio wave shielding member from the outside.

The radio wave absorbing sheet has high flexibility and can easily be attached to the inner surface of the radio wave shielding member that may have various shapes Thus it is possible to form the radio wave shielding member with a shape corresponding to the device to be measured. Moreover, the use of the radio wave absorbing sheet as the radio wave absorber can save the labor of replacement because the shape of the radio wave absorber is not changed, as compared to the use of a quadrangular pyramid-shaped radio wave absorber coated with carbon particles in, e.g., the conventional anechoic chamber. Further, the use of the radio wave absorbing sheet can avoid such a problem that the hands get dirty when replacing the radio wave absorber.

The radio wave absorbing sheet is a radio interference type (NM type or reflection type), and the frequency of the radio waves absorbed by the radio wave absorbing sheet can be changed by changing the thickness of the dielectric layer. Therefore, the radio wave shielding member of this embodiment can easily have a more appropriate configuration in accordance with, e.g., the device to be measured and the measurement conditions.

Hereinafter, a configuration example of the radio wave shielding member of this embodiment will be described. This example makes full use of the features of the radio wave shielding member and allows a device placed in the radio wave shielding member to be further housed in another radio wave shielding member to measure the radio wave properties.

Figure 12:
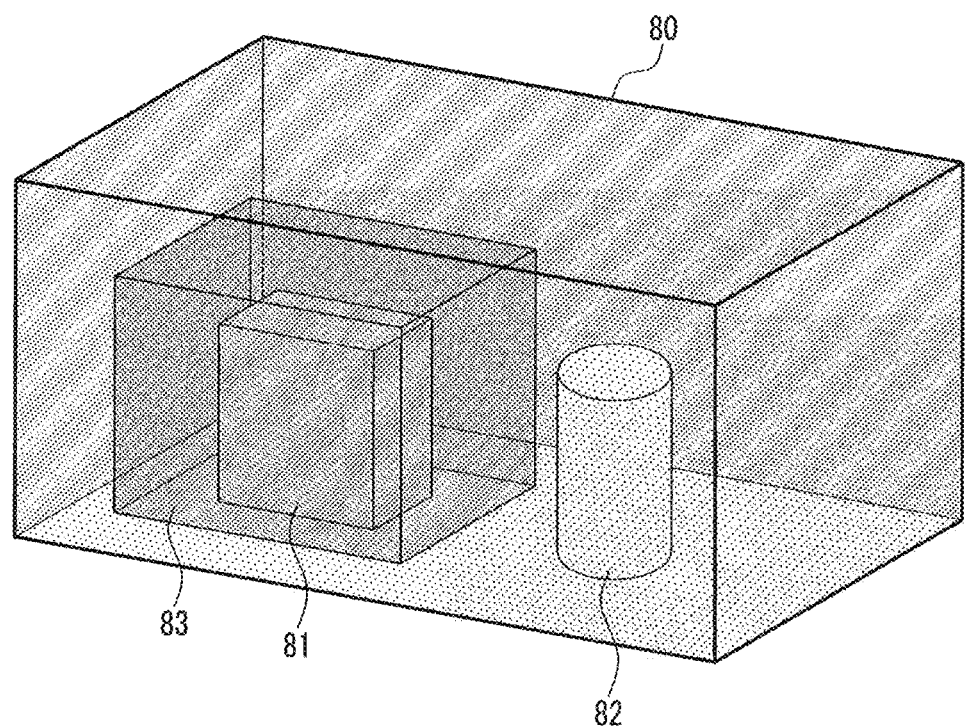
FIG. 12 is an image diagram illustrating another example of the use of the radio wave shielding member of this embodiment.

FIG. 12 is an image diagram illustrating another example of the use of the radio wave shielding member of this embodiment.

In FIG. 12, the transmitter 81 and the receiver 82 shown in FIG. 11 are used in the measurement of the radio wave properties, and only the transmitter 81 is further covered with another radio wave shielding member 83 in the radio wave shielding member 80. In this state, the radio waves received by the receiver 82 are analyzed so that only the noise components of the received radio waves can be detected. Therefore, by subtracting the data received in the state of FIG. 12 from the data of the radio waves transmitted from the transmitter 81 and received by the receiver 82 in the state of FIG. 11, only the radio waves transmitted from the transmitter 81 can be obtained with high accuracy.

As described above, the radio wave shielding member of this embodiment can easily be formed in accordance with the shape of the device to be measured. This makes it possible to measure the radio wave properties in various conditions, which cannot be achieved by the conventional large-scale anechoic chamber. For example, some device placed in the radio wave shielding member may be further hood in another radio wave shielding member to compare the measurement results of the radio wave properties. Needless to say, a plurality of measuring target devices and/or a plurality of measuring devices may be placed in a single radio wave shielding member.

In this embodiment, the radio wave shielding member is a substantially rectangular parallelepiped in overall shape. However, as described above, the radio wave absorbing sheet used for the radio wave shielding member has high flexibility and can be attached to any surface other than a flat surface. Therefore, there is no problem even if the radio wave shielding member has a curved surface to which the radio wave absorbing sheet is to be attached. For example, the radio wave shielding member may be in the form of a substantially rectangular parallelepiped in which the top and a part of the sides are curved, or may be in the form of a substantial cylinder, a hemisphere, a cone, or a truncated cone as a whole. Of course, the radio wave shielding member may be in the form of a substantially polygonal prism or a substantially polygonal pyramid as a whole, each of which consists of flat surfaces.

In this embodiment, all faces of the radio wave shielding member are rectangles and form a rectangular parallelepiped as a whole. The top and the four sides, and optionally the bottom, of the radio wave shielding member are made of the transparent base material, and the radio wave absorbing sheet with light transmittance and flexibility is attached to the base material. However, in some cases, the presence of a transparent portion like a peephole in the top or a part of the sides of the radio wave shielding member may be sufficient to make the situation in the radio wave shielding member directly visible from the outside. The radio wave shielding member of the present disclosure does not exclude such an embodiment in which only a part of the radio wave shielding member has light transmittance. In this case, the radio wave absorbing sheet with light transmittance may be attached to the inner wall of a portion of the housing that is not transparent. Alternatively, a radio wave absorbing sheet without light transmittance or another type of a radio wave absorber without light transmittance may be attached as well.

Needless to say, it is more preferable that the entire outer shell of the radio wave shielding member has light transmittance in order to ensure a wide field of view for the visual observation of the situation in the radio wave shielding member. The radio wave absorbing sheet used for the radio wave shielding member can easily be formed with a simple structure. Moreover, materials such as an acrylic plate and a glass plate are suitable for a transparent housing with high light transmittance, are readily available, and can easily be processed into a desired shape. For this reason, it may be easy to impart light transmittance to all the top and the sides of the radio wave shielding member. In many cases, it may be easier to provide the entire surface with light transmittance than to provide only a part of one surface with light transmittance.

Figure 13:
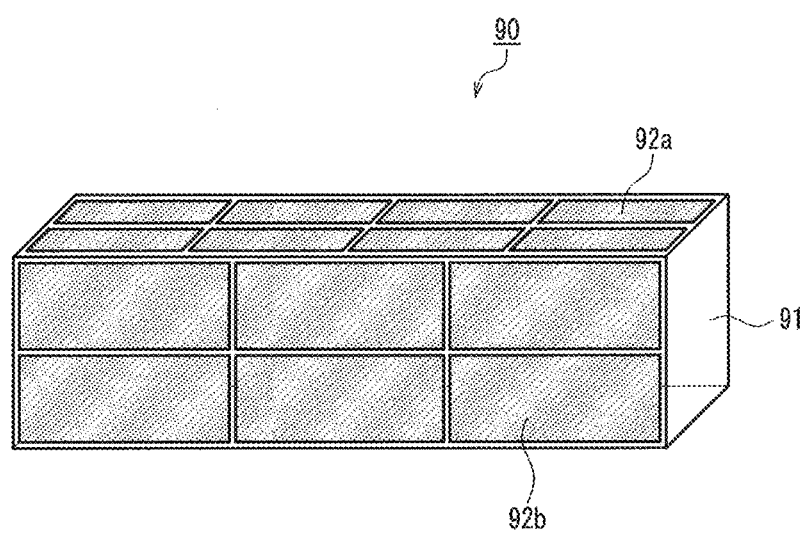
FIG. 13 is an image diagram illustrating another configuration example of the radio wave shielding member of this embodiment.

FIG. 13 is an image diagram illustrating another configuration example of the radio wave shielding member of this embodiment.

A radio wave shielding member 90 shown in FIG. 13 includes a transparent housing 91 and radio wave absorbing sheets 92a, 92b that are attached to the outer surface of the housing 91 with the resistive film facing outward. With this configuration, the radio wave absorbing sheets 92a, 92b absorb unwanted radio waves from the outside of the radio wave shielding member 90, so that the radio wave shielding member 90 can be protected from the penetration of unwanted radio waves. When the radio wave absorber is provided on the outer surface of the radio wave shielding member, a plurality of radio wave absorbing sheets may be attached to the surface of the housing with a large area. For example, as shown in FIG. 13, the radio wave absorbing sheets 91a, 91b having different vertical and horizontal sizes may be selectively used for the top and sides of the housing 91, which differ in shape, to cover the entire surface of the housing 91. If there is no possibility that unwanted radio waves will enter from the side or back of the housing 91, the radio wave absorbing sheets 91a, 91b may be attached to only the top and the front of the housing 91, as shown in FIG. 13.

In particular, like the radio wave absorbing sheets 91a, 91b shown in FIG. 13, it is possible to prepare at least a predetermined number of two or more types of radio wave absorbing sheets having different vertical and horizontal sizes. These sheets may be attached in a patchwork manner to the surfaces or inner walls of housings with different sizes and shapes depending on the measurement conditions. Thus, the radio wave shielding member can have any desired shape Since the radio wave absorbing sheet used for the radio wave shielding member has high flexibility and does not cause a change in the radio wave absorption properties even if it is strongly bent, the radio wave absorbing sheet can be removed and reattached more than once. Therefore, the radio wave shielding member has a great advantage in providing a measurement space of the radio wave properties at a low cost, which can prevent the effect of unwanted radio waves on the measurement accuracy, and achieve both a high degree of freedom and high versatility that would change the concept of the conventional anechoic chamber.

In the radio wave absorbing sheet of the above embodiment, the resistive film is a conductive polymer film and the radio wave shielding layer is a conductive mesh. However, there is no particular limitation to the materials of the resistive film and the radio wave shielding layer of the radio wave absorbing sheet, which has flexibility and light transmittance and is attached to the transparent support member in the measurement system and the radio wave shielding member of the present disclosure. Examples of the resistive film include a transparent resin dispersion film of silver nanowires and a transparent resin dispersion film of carbon nanotubes, in addition to the conductive polymer film. Examples of the radio wave shielding layer include a transparent resin dispersion film of silver nanowires and a transparent resin dispersion film of carbon nanotubes, in addition to the conductive mesh. In other words, various materials may be used for the resistive film and the radio wave shielding layer as long as they have a predetermined surface resistance, are flexible enough to be easily attached to and detached from the support member, and further have light transmittance that is required as a conductive member including the support member.

[Supplementary Note]

Hereinafter, the contents of the radio wave absorber of the present disclosure will be described again.

The radio wave absorber of the present disclosure includes a transparent support member and a radio wave absorbing sheet having flexibility and light transmittance, i.e., a total light transmittance of 60% or more. The radio wave absorbing sheet is attached to one surface of the support member. The radio wave absorbing sheet includes a resistive film, a dielectric layer, and a radio wave shielding layer which are stacked on top of each other and all of which have light transmittance. The resistive film is a conductive polymer film. The radio wave shielding layer is made of a conductive mesh.

The radio wave absorber with the above configuration is a so-called radio interference type ($\lambda/4$ type or reflection type) radio wave absorber that absorbs radio waves of a desired frequency by adjusting the thickness of the dielectric layer. Moreover, the radio wave absorber can have a desired shape because the radio wave absorbing sheet has flexibility and can easily be attached to the support member in various shapes. Further, the other side of the radio wave absorber is visible through it. For example, the measuring target device is directly visible through the radio wave absorber. Thus, the radio wave absorber can be suitably used for applications in which the measurement accuracy can be improved by absorbing unwanted radio waves during the measurement of the radio wave properties.

In the radio wave absorber, it is preferable that an adhesive layer is formed on the surface of the radio wave shielding layer facing away from the dielectric layer, and that the radio wave absorbing sheet is attached to the support member with the adhesive layer. Thus, the radio wave absorbing sheet can easily be attached to a desired portion of the support member, and the radio wave absorber can have various shapes.

It is preferable that a radio wave absorber has a projection on at least one side and another radio wave absorber has a recess on at least one side, and that the projection and the recess can be fitted together so that a plurality of radio wave absorbers can be connected to each other. This can easily adjust the area of the radio wave absorber by changing the number of radio wave absorbers to be fitted together.

The conductive mesh is preferably a fibrous conductive mesh with an aperture ratio of 35% or more and 85% or less.

The resistive film preferably contains poly(3,4-ethylenedioxythiophene), polystyrene sulfonate, and polyvinylidene fluoride.

The surface resistance of the resistive film is preferably in the range of −15% to +20% with respect to the dielectric constant of the vacuum.

The dielectric layer preferably has a thickness capable of absorbing radio waves in a high frequency band of the millimeter wave band or higher. Thus, the radio wave absorber has light transmittance and can absorb radio waves in the millimeter wave band, which has been increasingly used in recent years.

It is preferable that the electrical resistance of the resistive film measured by the flexibility test is not more than twice the initial electrical resistance. The flexibility test is performed as follows. The radio wave absorbing sheet is wound around an aluminum cylindrical rod with a diameter of 0.5 mm with the resistive film facing outward. A 300 g weight is attached to both ends of the sheet, and both ends are pulled downward and held for 30 seconds while the central portion of the sheet is being bent. Thus the radio wave absorbing sheet has high flexibility and causes little change in the radio wave absorption properties even if it is strongly bent. Therefore, the radio wave absorbing sheet can easily be attached to a transparent member that forms a curved surface. Moreover, since the radio wave absorbing sheet can easily be removed and reattached, the radio wave absorber can be provided at a low cost.

The total light transmittance of a portion to which the radio wave absorbing sheet is attached is preferably 60% or more. When the total light transmittance of the radio wave absorber including the transparent member is 60% or more, high visibility through the radio wave absorber can be ensured.

It is preferable that the radio wave absorbing sheet is removably attached to the support member.

It is preferable that the support member is deformable, and the radio wave absorber is configured to be deformable as a whole.

INDUSTRIAL APPLICABILITY

The radio wave absorber of the present disclosure has high radio wave absorption properties, and also has a significant feature that the other side of the radio wave absorber is visible through it. Therefore, the measurement state can be visually observed from the outside in each of the following cases: (i) where the radio wave absorber is used alone to block unwanted radio waves; (ii) where the radio wave absorber is used in the measurement system and placed on the back side of the measuring target device; and (iii) where the radio wave absorber is used as at least a part of the radio wave shielding member that houses the measuring target device. Moreover, the present disclosure is particularly useful in the measurement of various radio wave properties as the radio wave absorber, the measurement system, and the radio wave shielding member, all of which can easily be produced in accordance with the shape of the device to be measured.

DESCRIPTION OF REFERENCE NUMERALS

1 Radio wave absorbing sheet
2 Support member
3 Resistive film
4 Dielectric layer
5 Radio wave shielding layer
6 Adhesive layer
7 Protective layer
10 Radio wave absorber
11 Measuring target device
12 Measuring device

The invention claimed is:
1. A measurement system comprising:
a measuring target device;
a measuring device that emits and/or receives radio waves to measure the measuring target device; and
a radio wave absorber that has light transmittance and absorbs radio waves in and above a millimeter wave band,
wherein the radio wave absorber includes a transparent support member and a radio wave absorbing sheet that is attached to one surface of the support member,
the radio wave absorber has a fitting portion that can be fitted to a fitting portion of another radio wave absorber, and a plurality of the radio wave absorbers are fitted together through the fitting portions to form one radio wave absorber,
the radio wave absorbing sheet includes a resistive film, a dielectric layer, and a radio wave shielding layer which are stacked on top of each other and all of which have light transmittance, and
the radio wave absorber blocks and/or absorbs unwanted radio waves around the measuring target device.
2. The measurement system according to claim 1, wherein a total light transmittance of the radio wave absorber is 30% or more.
3. The measurement system according to claim 1, wherein the measuring target device is a device that emits and/or receives radio waves in and above the millimeter wave band.
4. The measurement system according to claim 1, wherein the support member is deformable and the radio wave absorber is deformable in accordance with a shape of the measuring target device and/or the measuring device.
5. The measurement system according to claim 1, wherein the radio wave absorber is placed at least on a back side of the measuring target device as viewed from the measuring device.
6. The measurement system according to claim 1, wherein the radio wave absorber constitutes at least a part of a side and a top of a radio wave shielding member that houses the measuring device and/or the measuring target device.
7. The measurement system according to claim 6, wherein the measuring device and/or the measuring target device are housed in separate radio wave shielding members.
8. The measurement system according to claim 6, wherein another radio wave shielding member that houses the measuring device and/or the measuring target device is further arranged in the radio wave shielding member.

9. The measurement system according to claim 6, wherein the radio wave shielding member houses a plurality of the measuring target devices and/or a plurality of the measuring devices.

10. The measurement system according to claim 6, wherein the radio wave shielding member covers a bottom of the measuring device and/or the measuring target device.

11. The measurement system according to claim 6, wherein the radio wave shielding member includes a transparent housing to which the radio wave absorbing sheet is attached.

12. The measurement system according to claim 11, wherein a plurality of the radio wave absorbing sheets are attached to the housing and spaced at intervals of 3 mm or less.

13. A radio wave shielding member comprising:
a housing that covers sides and a top of a measuring target device and/or a measuring device that emits and/or receives radio waves in and above a millimeter wave band to measure the measuring target device,
wherein the radio wave shielding member is able to house the measuring target device and/or the measuring device,
the radio wave shielding member has a fitting portion that can be fitted to a fitting portion of another radio wave shielding member, and a plurality of the radio wave shielding members are fitted together through the fitting portions to form one radio wave shielding member,
at least a portion of the housing is transparent, and a radio wave absorbing sheet is attached to the transparent portion of the housing, and
the radio wave absorbing sheet includes a resistive film, a dielectric layer, and a radio wave shielding layer which are stacked on top of each other and all of which have light transmittance.

14. The radio wave shielding member according to claim 13, wherein the housing further covers a bottom of the measuring device and/or the measuring target device.

15. The radio wave shielding member according to claim 13, wherein a total light transmittance of the portion to which the radio wave absorbing sheet is attached is 30% or more.

16. The radio wave shielding member according to claim 13, wherein the radio wave shielding member houses a plurality of the measuring target devices and/or a plurality of the measuring devices.

17. The radio wave shielding member according to claim 13, wherein the measuring target device is a device that emits and/or receives radio waves in and above the millimeter wave band.

* * * * *